(12) United States Patent
Sung et al.

(10) Patent No.: US 7,888,860 B2
(45) Date of Patent: Feb. 15, 2011

(54) ORGANIC LIGHT EMITTING DEVICE

(75) Inventors: Un-cheol Sung, Anyang-si (KR);
Jung-Soo Rhee, Seoul (KR);
Beohm-Rock Choi, Seoul (KR);
Jun-Ho Choi, Yongin-si (KR);
Jae-Kook Ha, Yongin-si (KR);
Soo-Yeon Lee, Yongin-si (KR);
Seong-Min Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 781 days.

(21) Appl. No.: 11/844,657

(22) Filed: Aug. 24, 2007

(65) Prior Publication Data

US 2008/0048560 A1   Feb. 28, 2008

(30) Foreign Application Priority Data

Aug. 25, 2006   (KR)   ........................ 10-2006-0080847
Oct. 11, 2006   (KR)   ........................ 10-2006-0098742

(51) Int. Cl.
*H01J 1/62* (2006.01)
*H01J 63/04* (2006.01)
*H05B 33/00* (2006.01)

(52) U.S. Cl. .................. 313/504; 313/506; 313/113

(58) Field of Classification Search ......... 313/503–506, 313/512, 113, 114; 315/169.1, 169.3; 345/36, 345/45, 76

See application file for complete search history.

(56) References Cited

U.S. PATENT DOCUMENTS

| 6,919,681 | B2 | 7/2005 | Cok et al. |
| 7,030,553 | B2 | 4/2006 | Winters et al. |
| 2005/0225232 | A1 | 10/2005 | Boroson et al. |

FOREIGN PATENT DOCUMENTS

| JP | 2004311440 | 11/2004 |
| JP | 2005108737 | 4/2005 |
| JP | 2006032327 | 2/2006 |
| JP | 2006100187 | 4/2006 |
| KR | 1020060027330 | 3/2006 |
| KR | 1020060044593 | 5/2006 |
| KR | 1020060047610 | 5/2006 |
| KR | 1020060055211 | 5/2006 |
| KR | 1020060066003 | 6/2006 |
| WO | 2005/020344 A1 | 3/2005 |

*Primary Examiner*—Joseph L Williams
(74) *Attorney, Agent, or Firm*—Cantor Colburn LLP

(57) ABSTRACT

An organic light emitting device includes a plurality of colored pixels, and a white pixel, wherein the respective pixels include; a first electrode, a second electrode which faces the first electrode, and a light emitting member disposed between the first electrode and the second electrode, and the white pixel further includes; a first semi-transparent member disposed on the first electrode to form a microcavity with the second electrode.

14 Claims, 28 Drawing Sheets

FIG.2

| B | W | B | W | B |
|---|---|---|---|---|
| G | R | G | R | G |
| B | W | B | W | B |
| G | R | G | R | G |
| B | W | B | W | B |

(a)

(b)

(c)

ORGANIC LIGHT EMITTING DEVICE

This application claims priority to Korean Patent Application No. 10-2006-0080847, filed on Aug. 25, 2006, and Korean Patent Application No. 10-2006-0098742 filed on Oct. 11, 2006, and all the benefits accruing therefrom under 35 U.S.C. §119, the contents of which in their entirety are herein incorporated by reference.

BACKGROUND OF THE INVENTION (a) Field of the Invention

The present invention relates to an organic light emitting device.

(b) Description of the Related Art

Recently, liquid crystal displays ("LCDs") are being substituted for cathode ray tubes ("CRTs") wherever a lighter and/or thinner display is desired.

However, LCDs have many problems. One of which is that LCDs require a separate backlight as a light emitting and receiving element, and in addition LCDs have a slow response speed and a narrow-viewing angle.

As a display device for solving these problems, an organic light emitting device ("OLED") has come into the spotlight in recent times.

An OLED includes two electrodes with an emitting layer interposed therebetween. In an OLED, electrons are injected from one electrode and holes are injected from the other electrode and both electrons and holes are recombined in the emitting layer to form excitons. Light is emitted when the excitons release energy.

Since the OLED is a self-emission type of display in which a separate light source is not necessary, it has the advantages of low power consumption, a good response speed, a wide viewing angle, and a good contrast ratio.

The OLED includes a plurality of pixels including, for example, a red pixel, a blue pixel, and a green pixel and can produce a full color display by combining the light emitted by these pixels. In one arrangement, each of the differently colored pixels uses a light emitting layer composed of a different material to produce emitted light of different wavelengths (and therefore different colors).

Alternatively, the OLED may include pixels wherein each pixel emits only a white light. One method of producing such a pixel is to include a red, blue and green light emitting layer within a single pixel, which thereby emits a white light. In such an alternative configuration, an additional color filter layer having red, blue and green components must be added in order to produce a color display.

However, the OLED has different light emission efficiencies depending on the light emitting material used to produce the variously colored pixels. In other words, the same amount of applied voltage may produce a different amount of emitted light in each of the differently colored pixels. In this case, among red, green, and blue colors, the color having low emission efficiency does not have a predetermined color coordinate. In addition, the emission efficiency of a white light generated by a combination of the red, green, and blue colors is reduced due to the inclusion of a color having a light emitting layer with a low emission efficiency.

BRIEF SUMMARY OF THE INVENTION

The present invention has been made in an effort to provide an organic light emitting device having advantages of improved color quality.

An exemplary embodiment of an organic light emitting device according to the present invention includes a plurality of colored pixels, and a white pixel, wherein the respective pixels include; a first electrode, a second electrode which faces the first electrode, and a light emitting member disposed between the first electrode and the second electrode, and the white pixel further includes a first semitransparent member disposed on the first electrode to form a microcavity with the second electrode.

In one exemplary embodiment the first semi-transparent member may include Ag, Al or a combination of Ag and Al.

The light emitting member may include a plurality of sub-emitting layers which emit light having different wavelengths, and the light having different wavelengths may be combined to emit a substantially white light.

In one exemplary embodiment the white light may have a yellowish tint.

In one exemplary embodiment, the first semi-transparent member may be formed at only a portion of a region through which the white light passes.

In one exemplary embodiment the plurality of colored pixels includes a red pixel, a green pixel, and a blue pixel, and each of the colored pixels may further include a color filter formed below the first electrode.

In one exemplary embodiment a pixel having the lowest emission efficiency among the plurality of colored pixels may further include; a second semi-transparent member disposed on the first electrode to form the microcavity together with the second electrode.

In one exemplary embodiment the pixel having the lowest emission efficiency may be a blue pixel.

In one exemplary embodiment the second semi-transparent member may include Ag, Al, or a combination of Ag and Al.

In one exemplary embodiment the second semi-transparent member may be formed over substantially the entire region through which the white light passes.

In one exemplary embodiment the plurality of colored pixels comprise a red pixel and a green pixel and the red pixel and the green pixel may further include a color filter formed below the first electrode.

In one exemplary embodiment the organic light emitting device may further include a driving thin film transistor connected to the first electrode including a polycrystalline semiconductor, and a switching thin film transistor connected to the driving thin film transistor including an amorphous semiconductor.

In one exemplary embodiment the driving thin film transistor may further include; a driving input electrode formed on the polycrystalline semiconductor, a driving output electrode which faces the driving input electrode on the polycrystalline semiconductor, and a driving control electrode formed on the driving input electrode and the driving output electrode.

In one exemplary embodiment the switching thin film transistor may further include; a switching control electrode formed below the amorphous semiconductor, a switching input electrode formed on the amorphous semiconductor, and a switching output electrode which faces the switching input electrode on the amorphous semiconductor and is connected to the driving control electrode.

In another exemplary embodiment an organic light emitting device includes a plurality of pixels, wherein each of the respective pixels include; a switching thin film transistor, a driving thin film transistor connected to the switching thin film transistor, a first electrode connected to the driving thin film transistor, a light emitting member formed on the first electrode and which emits a white light, and a second electrode formed on the light emitting member, and the plurality of pixels include; a first pixel group comprising a plurality of pixels provided with a semi-transparent member forming a microcavity together with one of the first and second electrodes in a region of each of the pixels through which the white light passes, and a second pixel group comprising a plurality of pixels provided with a color filter in the region of each of the pixels through which the white light passes.

In one exemplary embodiment the white light may have a yellowish tint.

In one exemplary embodiment the first pixel group may include a white pixel.

In one exemplary embodiment the semi-transparent member may be formed at only a portion of the region of each of the pixels through which the white light passes.

In one exemplary embodiment the first pixel group may include a blue pixel.

In one exemplary embodiment the second pixel group may include at least one of a red pixel and a green pixel.

In another exemplary embodiment an organic light emitting device includes; a first electrode including a conductor which reflects light, a second electrode which faces the first electrode and includes a semi-transparent conductor, a first organic light emitting member interposed between the first electrode and the second electrode and includes a first emitting layer which emits a first color, a third electrode which faces the second electrode and includes a transparent conductor, and a second organic light emitting member interposed between the second electrode and the third electrode including a second emitting layer which emits a second color and a third emitting layer which emits a third color, wherein the first electrode and the second electrode form a microcavity, and the first organic light emitting member emits light of the first color having a color purity improved by the microcavity toward the second electrode.

In one exemplary embodiment the first electrode, the first organic light emitting member, and the second electrode may form a first organic light emitting element, and the second electrode, the second organic light emitting member, and the third electrode may form a second organic light emitting element.

In one exemplary embodiment the first organic light emitting element and the second organic light emitting element may have different emission efficiencies.

In one exemplary embodiment the first emitting layer, the second emitting layer, and the third emitting layer may have different thicknesses.

In one exemplary embodiment the first color may be a blue, the second color may be a green, and the third color may be a red.

In one exemplary embodiment the first electrode may have a first work function, the second electrode may have a second work function higher than the first work function, and the third electrode may have a third work function higher than the second work function.

In another exemplary embodiment an organic light emitting device includes; a first electrode including a conductor which reflects light, a second electrode which faces the first electrode and includes a semi-transparent conductor, a first organic light emitting member interposed between the first electrode and the second electrode including a first emitting layer which emits a first color and a second emitting layer which emits a second color, a third electrode which faces the second electrode and includes a transparent conductor, and a second organic light emitting member formed between the second electrode and the third electrode including a third emitting layer which emits a third color, wherein the first electrode and the second electrode form a microcavity, and light of the third color having a color purity improved by the microcavity is emitted toward the third electrode, the light of the third color being emitted from the third emitting layer, passing through the second electrode, reflecting from the first electrode, and passing again through the second electrode before passing through the third electrode.

In one exemplary embodiment the first color may be a green, the second color may be a red, and the third color may be a blue.

BRIEF DESCRIPTION OF THE DRAWINGS

The foregoing and other aspects, features, and advantages of the present invention will become more apparent from the following detailed description of the present invention when taken in conjunction with the accompanying drawings, in which:

FIG. 2 is a schematic view showing an exemplary embodiment of an arrangement of a plurality of pixels in the exemplary embodiment of an organic light emitting device according to the present invention;

DETAILED DESCRIPTION OF THE INVENTION

Figure 1:
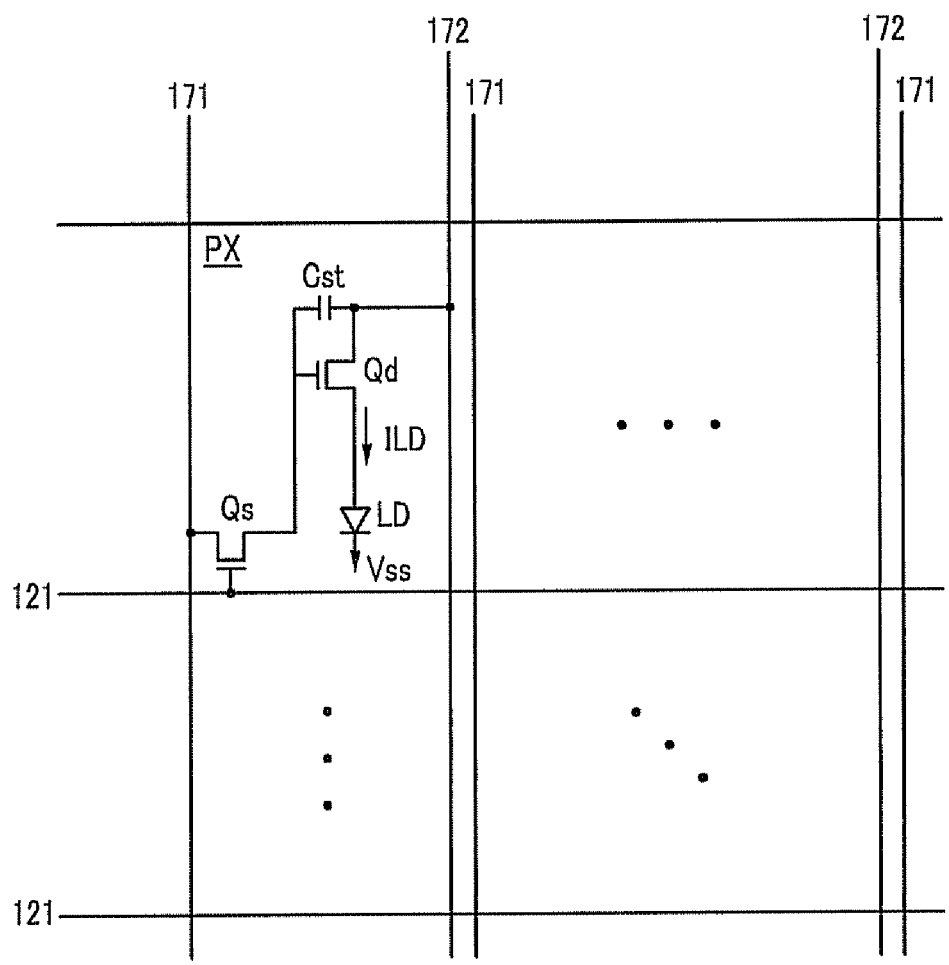
FIG. 1 is an equivalent circuit diagram showing an exemplary embodiment of an organic light emitting device according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in more detail with reference to the accompanying drawings.

First, an organic light emitting device according to one exemplary embodiment of the invention will be described more fully with reference to FIG. 1.

FIG. 1 is an equivalent circuit diagram showing an exemplary embodiment of an organic light emitting device according to the present invention.

Referring to FIG. 1, the exemplary embodiment of an organic light emitting device according to the present invention includes a plurality of signal lines 121, 171, and 172 and a plurality of pixels PX which are connected to the signal lines. The plurality of pixels PX are approximately arranged in a matrix.

The signal lines include a plurality of gate lines 121 transmitting gate signals (also called scanning signals), a plurality data lines 171 transmitting data signals, and a plurality of driving voltage lines 172 transmitting driving voltages. The gate lines 121 extend substantially in a row direction and are approximately parallel to each other, and the data lines 171 and the driving voltage lines 172 extend substantially perpendicular to the gate lines 121 in a column direction and approximately parallel to each other.

Each pixel PX includes a switching thin film transistor Qs, a driving thin film transistor Qd, a storage capacitor Cst, and an organic light emitting diode LD.

The switching thin film transistor Qs has a control terminal, an input terminal, and an output terminal. The control terminal of the switching thin film transistor Qs is connected to the gate lines 121, the input terminal of the switching thin film transistor Qs is connected to the data lines 171, and the output terminal of the switching thin film transistor Qs is connected to the driving thin film transistor Qd. The switching thin film transistor Qs transmits the data signals applied to the data lines 171 to the driving thin film transistor Qd in response to the scanning signals applied to the gate lines 121.

The driving transistor Qd also has a control terminal, an input terminal, and an output terminal. The control terminal of the driving transistor Qd is connected to the switching transistor Qs, the input terminal of the driving transistor Qd is connected to the driving voltage lines, and the output terminal of the driving transistor Qd is connected to the organic light emitting diode LD. The driving thin film transistor Qd allows an output current $I_{LD}$ to flow to the organic light emitting diode LD. The intensity of the output current $I_{LD}$ varies depending on the voltages applied between the control terminal and the output terminal.

The capacitor Cst is connected between the control terminal and the input terminal of the driving thin film transistor Qd. The capacitor Cst charges the data signals applied to the control terminal of the driving thin film transistor Qd and maintains the charged data signals even after the switching thin film transistor Qs is turned off.

The organic light emitting diode LD has an anode connected to the output terminal of the driving thin film transistor Qd and a cathode connected to a common voltage Vss. The organic light emitting diode LD emits light with a varying intensity depending on the magnitude of the output current $I_{LD}$ supplied from the driving thin film transistor Qd. A plurality of pixels, each including a light emitting diode may be used together to thereby display an image.

In the present exemplary embodiment the switching thin film transistor Qs and the driving thin film transistor Qd are n-channel field effect transistor ("FET"). However, in an alternative exemplary embodiment at least one of the switching thin film transistor Qs and the driving thin film transistor Qd may be p-channel FET. In addition, alternative exemplary embodiments include configurations wherein the connection relationship among the thin film transistors Qs and Qd, the capacitor Cst, and the organic light emitting diode LD may be interchanged.

Now, a detailed structure of the organic light emitting device shown in FIG. 1 will be described with reference to FIGS. 2 to 5 together with FIG. 1.

Figure 2:
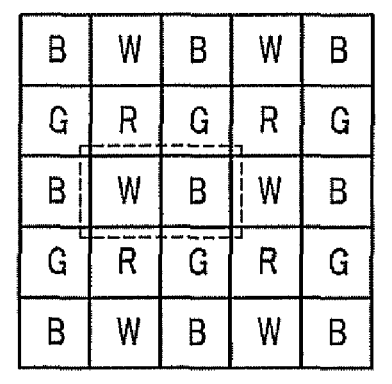
Figure 3:
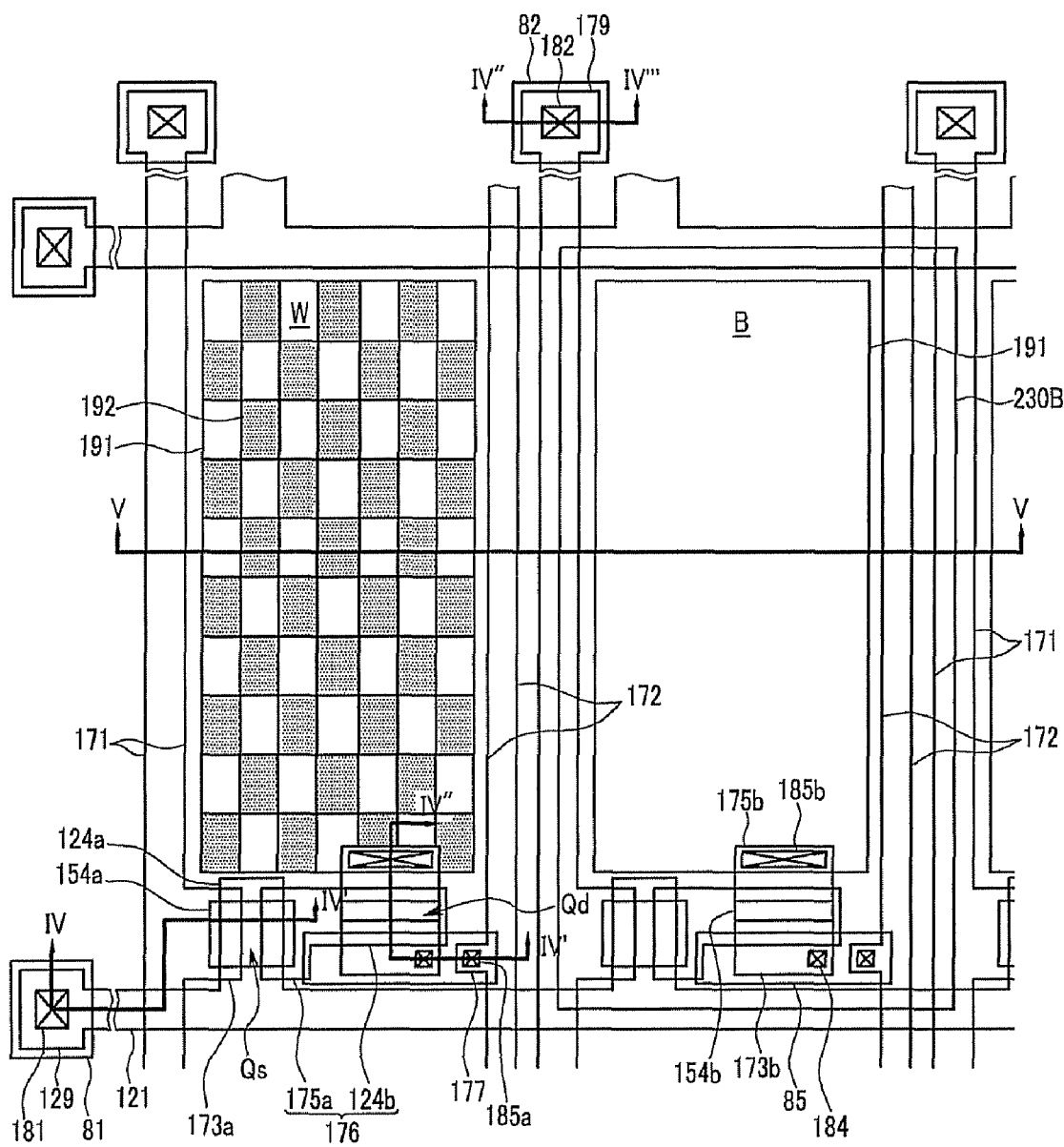
FIG. 3 is a top plan view layout showing two pixels adjacent to each other in the exemplary embodiment of an organic light emitting device of FIG. 2.
Figure 4:
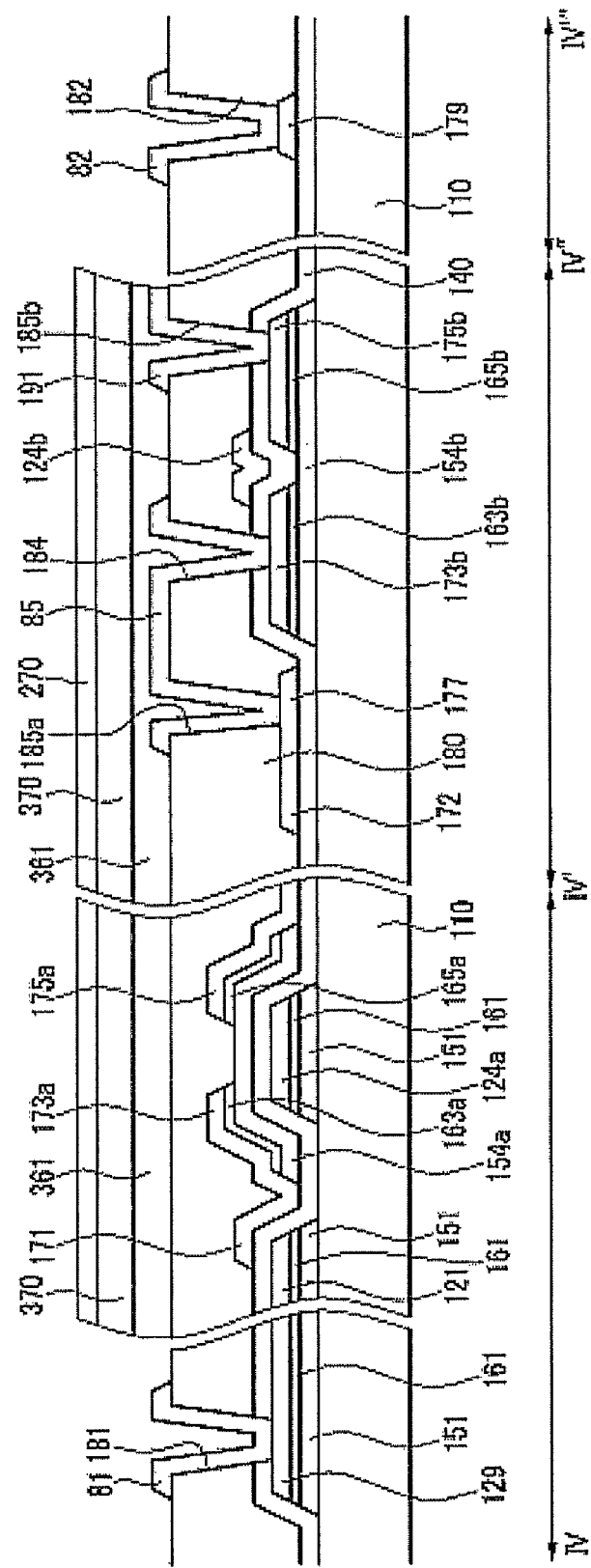
FIG. 4 and FIG. 5 are cross-sectional views taken along lines IV-IV'-IV"-IV'" and V-V of FIG. 3, respectively.
Figure 5:
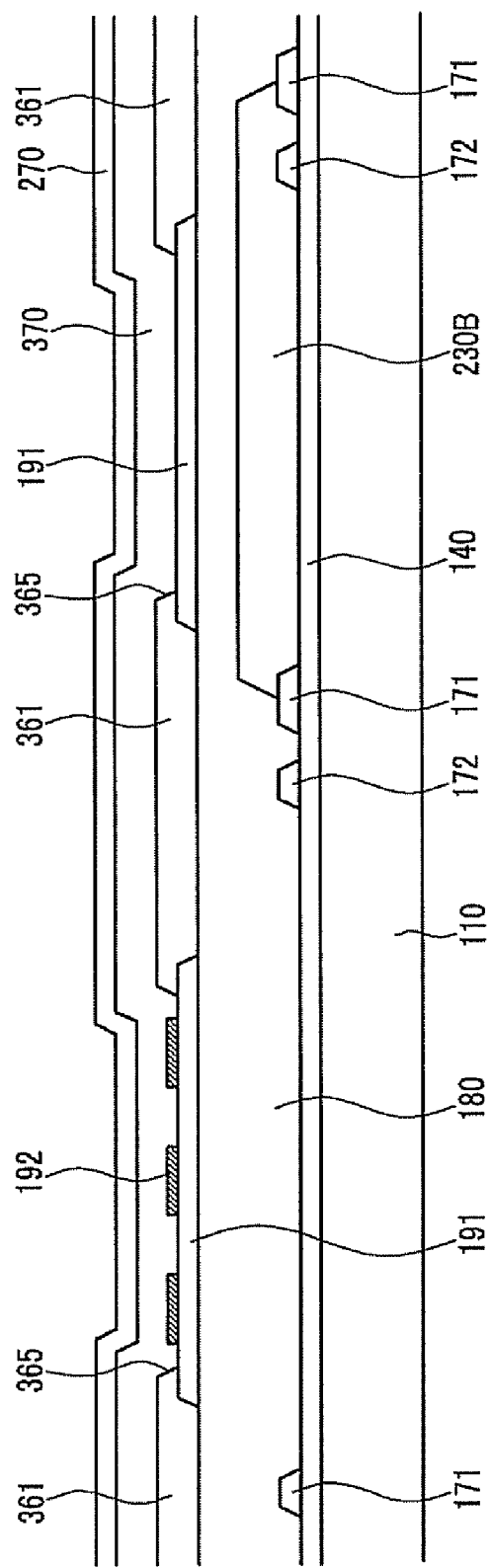

FIG. 2 is a schematic view showing an exemplary embodiment of an arrangement of a plurality of pixels in the exemplary embodiment of an organic light emitting device according to the present invention, FIG. 3 is a top plan view layout showing two pixels adjacent to each other in the exemplary embodiment of an organic light emitting device of FIG. 2, and FIG. 4 and FIG. 5 are cross-sectional views taken along lines IV-IV'-IV"-IV'" and V-V of FIG. 3, respectively.

First, referring to FIG. 2, a red pixel R displaying a red color, a green pixel G displaying a green color, a blue pixel B displaying a blue color, and a white pixel W not displaying any color are alternatively arranged in the organic light emitting device according to one exemplary embodiment of the invention. In the present exemplary embodiment, four pixels including the red pixel R, the green pixel G, the blue pixel B, and the white pixel W form one group and that group may be repeated along a row and/or column. However, the formation shown in FIG. 2 is but one exemplary embodiment and alternative exemplary embodiments include configurations wherein the arrangement of the pixels may be variously transformed.

As described above, it is possible to improve luminance of the display by further including the white pixel W in addition to the red pixel R, the green pixel G, and the blue pixel B.

Next, the detailed structure of the organic light emitting device will be described more fully with reference to FIGS. 3 to 5.

FIG. 3 shows the white pixel W and the blue pixel B as indicated by a dotted line in the exemplary embodiment of an organic light emitting device of FIG. 2. In the two pixels, the structure of the gate lines 121, the data lines 171, the driving voltage lines 172, the switching thin film transistor Qs, and the driving thin film transistor Qd are substantially similar to each other, but the structure of the organic light emitting diode is different in the different pixels. Accordingly, the same reference numerals refer to similar components in FIG. 3.

A plurality of driving semiconductors 154b and a plurality of linear semiconductor members 151 are formed on an insulating substrate 110. Exemplary embodiments of the insulating substrate 110 may be made of a transparent glass or plastic.

The driving semiconductors 154b have an island-shape, and the linear semiconductor members 151 extend substantially in a transverse direction. The driving semiconductors 154b and the linear semiconductor members 151 may be made of a crystalline semiconductor material exemplary embodiments of which include microcrystalline silicon or polycrystalline silicon.

A plurality of gate lines 121, a plurality of driving input electrodes 173b, and a plurality of driving output electrodes 175b are formed on the driving semiconductors 154b and linear semiconductor members 151.

The gate lines 121 transmit the gate signals and extend substantially in a transverse direction. Each gate line 121 includes a switching control electrode 124a extending upward and an end portion 129 for connecting with another layer or an external driving circuit. In an alternative exemplary embodiment where a gate driving circuit (not shown) generating gate signals is integrated on a substrate 110, the gate lines 121 may be extended to be directly connected to the gate driving circuit.

The gate lines 121 have substantially the same planar shape as those of the linear semiconductor members 151.

The driving input electrodes 173b and the driving output electrodes 175b have island shapes, respectively, and are separated from the gate lines 121. The driving input electrodes 173b face the driving output electrodes 175b and are disposed on the driving semiconductors 154b.

In one exemplary embodiment the gate lines 121, the driving input electrodes 173b, and the driving output electrode 175b may be made of an aluminum-containing metal such as aluminum (Al) or an aluminum alloy, a silver-containing metal such as silver (Ag) or a silver alloy, a copper-containing metal such as copper (Cu) or a copper alloy, a molybdenum-containing metal such as molybdenum (Mo) or a molybdenum alloy, chrome (Cr), tantalum (Ta) or titanium (Ti).

In an alternative exemplary embodiment the gate lines 121, the driving input electrodes 173b, and the driving output electrode 175b may have a multi-layered structure including two conductive layers (not shown) having different physical characteristics.

In one exemplary embodiment the gate lines 121, the driving input electrodes 173b, and the driving output electrode 175b may be inclined at an angle between about 30 degrees and about 80 degrees relative to the surface of the substrate 110.

A pair of ohmic contacts 163b and 165b are formed between the driving semiconductors 154b and the driving input electrodes 173b and between the driving semiconductors 154b and the driving output electrodes 175b, respectively. In addition, impurity doped linear semiconductor members 161 are formed between the gate lines 121 and the linear semiconductor members 151.

In one exemplary embodiment the linear semiconductor members 161 and the ohmic contacts 163b and 165b may be made of microcrystalline silicon heavily doped with an n-type impurity such as phosphorus (P) or crystalline semiconductor material doped with an impurity such as a polysilicon.

A gate insulating layer 140, exemplary embodiments of which are made of silicon oxide ($SiO_2$) or silicon nitride ("SiNx"), is formed on the gate lines 121, the driving input electrodes 173b, and the driving output electrode 175b. In one exemplary embodiment the gate insulating layer 140 may be a single layer and in an alternative exemplary embodiment the gate insulating layer 140 may include a plurality of layers including a first layer made of silicon oxide and a second layer made of silicon nitride.

A plurality of switching semiconductors 154a, exemplary embodiments of which are made of hydrogenated amorphous silicon, are formed on the gate insulating layer 140. The switching semiconductors 154a have island shapes and overlap with a switching control electrode 124a.

A plurality of data lines 171, a plurality of driving voltage lines 172, and a plurality of electrode members 176 are formed on the switching semiconductors 154a and the gate insulating layer 140.

The data lines 171 transmit the data signals and extend substantially in the vertical direction to intersect the gate lines 121. The data lines 171 are electrically insulated from the gate lines 121. Each data line 171 includes a plurality of switching input electrode 173a extending toward the switching control electrodes 124a and an end portion 179 for connecting with another layer or an external driving circuit. In the exemplary embodiment where a data driving circuit (not shown) generating data signals is integrated on a substrate 110, the data lines 171 may be extended to be directly connected to the gate driving circuit.

Driving voltage lines 172 transmit driving voltages and extend substantially in the vertical direction to intersect the gate lines 121. In addition, the driving voltage lines 172 are substantially parallel to the data lines 171. Each driving voltage line 172 includes a projection 177. Alternative exemplary embodiments include configurations wherein the driving voltage lines 172 are disposed substantially parallel to the gate lines 121.

Electrode members 176 have an island shape and are separated from the data lines 171 and the driving voltage lines 172. The electrode members 176 include a portion 175a (hereinafter, referred to as 'switching output electrode') facing the switching input electrodes 173a and a portion 124b (hereinafter, referred to as 'driving control electrode') overlapping with the driving semiconductors 154b. The switching input electrodes 173a face the switching output electrodes 175a on the switching semiconductors 154a.

In one exemplary embodiment the data lines 171, the driving voltage lines 172, and the electrode members 176 may be made of the same material as that of the above-described gate lines 121.

The lateral side of the data lines 171, the driving voltage lines 172, and the electrode members 176 may be inclined at an angle between about 30 degrees and about 80 degrees relative to the surface of the substrate 110.

A pair of ohmic contacts 163a and 165a are formed between the switching semiconductors 154a and the switching input electrodes 173a and between the switching semiconductors 154a and the switching output electrodes 175a, respectively. The ohmic contacts 163a and 165a have an island shape and in one exemplary embodiment may be made of hydrogenated amorphous silicon or other similar materials which are heavily doped with impurity such as phosphorus (P).

A color filter is formed on the data lines 171, the driving voltage lines 172, and the electrode members 176. Since FIGS. 3 to 5 show only a white pixel W and a blue pixel B, a blue color filter 230B is shown in only the blue pixel B. However, a red color filter (not shown), a green color filter (not shown), and a blue color filter 230B are actually formed in the red pixel R, the green pixel G, and the blue pixel B, respectively. In the current exemplary embodiment the white pixel W does not include the color filter. Alternative exemplary embodiments include configurations wherein the white pixel W may include a transparent filter (not shown).

The color filter 230B is not formed at the end portion 129 of the gate lines 121 and the end portion 179 of the data lines 171 for connecting with the external circuit, and the edge of the color filter 230B may overlap the data lines 171 and the gate lines 121. As described above, by forming the color filter 230B with an overlapping edge, it may prevent light from being leaked between the pixels.

In one exemplary embodiment an interlayer insulating layer (not shown) may be formed under the color filter 230B. The interlayer insulating layer may prevent the pigment of the color filter from flowing into the driving semiconductor 154b or the switching semiconductor 154a.

A passivation layer 180 is formed on the color filter 230B, the data lines 171, the driving voltage lines 172, and the electrode members 176.

A plurality of contact holes 185a and 182 for exposing the projection 177 of the driving voltage line 172 and the end portion 179 of the data line 171, respectively, are formed in the passivation layer 180, and a plurality of contact holes 181, 184 and 185b for exposing the end portion 129 of the gate lines 121, the driving input electrodes 173b, and the driving output electrode 175b, respectively, are formed in the passivation layer 180 and the gate insulating layer 140.

A plurality of pixel electrodes 191, a plurality of connection members 85, and a plurality of contact assistants 81 and 82 are formed on the passivation layer 180.

The pixel electrodes 191 are connected to the driving output electrodes 175b through the contact holes 185b.

The connection members 85 are connected to the projection 177 of the driving voltage lines 172 and the driving input electrode 173b through the contact holes 184 and 185a, respectively. In addition, the connection members 85 overlap a portion of the driving control electrodes 124b, thereby forming a storage capacitor Cst.

The contact assistants 81 and 82 are connected to the end portion 129 of the gate lines 121 and the end portion 179 of the data lines 171 through the contact holes 181 and 182, respectively. The contact assistants 81 and 82 complement the adhesion between the end portion 129 of the gate lines 121 and the end portion 179 of the data lines 171 when they are adhered to the external devices, and prevent the above elements from separating.

In one exemplary embodiment the pixel electrodes 191, the connection member 85, and the contact assistants 81 and 82 may be made of a transparent conductive material, such as indium zinc oxide ("IZO") or indium tin oxide ("ITO").

A plurality of semi-transparent members 192 are formed on the pixel electrode 191 of the white pixel W. The material of the semi-transparent member 192 is not particularly limited as long as the material transmits a portion of light and reflects a portion of light. Exemplary embodiments of the semi-transparent members 192 include a conductor such as Al or Ag which is opaque and has a low absorbent coefficient formed to have a thin thickness of about 10 Å to about 100 Å so as to be semi-transparent.

According to this exemplary embodiment of the present invention, the semi-transparent member 192 is located on the pixel electrode 191, but alternative exemplary embodiments include configurations wherein the semi-transparent members 192 may be located under the pixel electrode 191.

In the current exemplary embodiment the red pixel R, the green pixel G, and the blue pixel B do not include the semi-transparent member 192.

The semi-transparent member 192 is formed at only some of the region through which light emitted from an emitting layer passes, and the pixel electrode 191 is exposed in the others region.

FIG. 3 to FIG. 5 show illustratively the semi-transparent member 192 having a checkerboard pattern, but the present invention is not limited thereto. Alternative exemplary embodiments include configurations wherein it may be formed with the shapes shown in FIG. 6.

Figure 6:
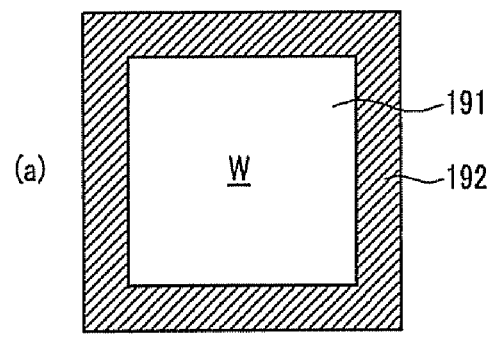
FIG. 6 is a schematic view illustratively showing exemplary embodiments of the shape of a semi-transparent member formed at a white pixel (W)
Figure 6:
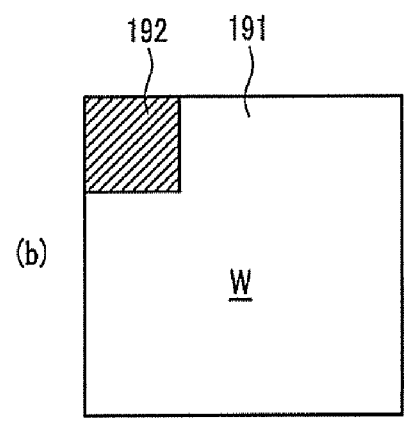
Figure 6:
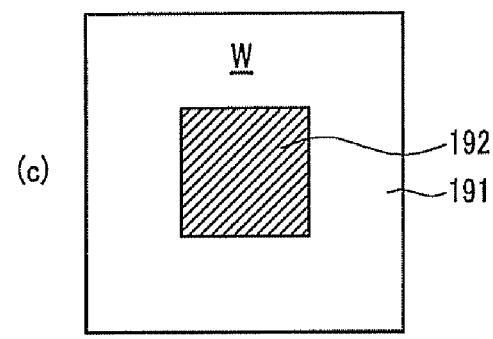

FIG. 6 is a schematic view illustratively showing exemplary embodiments of the shape of the semi-transparent member 192 formed at the white pixel W.

In FIG. 6, (a) shows the shape of the semi-transparent member 192 in a configuration which is formed along the edges of the pixel electrode 191, (b) shows the shape of the semi-transparent member 192 in a configuration which is formed at only one corner of the pixel electrode 191, and (c) shows the shape of the semi-transparent member 192 in a configuration which is formed at the center of the pixel electrode 191. In any of the above-described exemplary embodiments, the semi-transparent member 192 is formed at only a portion of the region through which light emitted from the emitting layer passes, and the pixel electrode 191 is exposed to the other regions. Light passed through the pixel electrode 191 is transmitted into the overall surface of the substrate while only some of the light passed to the semi-transparent member 192 is transmitted into the overall surface of the substrate and the light which is not transmitted through the semi-transparent member 192 is reflected.

Referring again to FIGS. 3-5, an insulating bank 361 is formed on the pixel electrode 191, the semi-transparent member 192, the connection member 85, and the passivation layer 180. The insulating bank 361 encloses the edge of the pixel electrode 191 to define an opening 365. Exemplary embodiments of the insulating bank 361 may be made of an organic insulator such as acrylic resin, polyimide resin having thermal resistance and solvent resistance or an inorganic insulator such as silicon dioxide ($SiO_2$) and titanium dioxide ($TiO_2$), and may have a multi-layered structure composed of two-or more layers. In one exemplary embodiment the insulating bank 361 may be made of a photosensitive material including a black pigment. In such an exemplary embodiment, the insulating bank 361 serves as a light-blocking member, and the process of forming such a bank is simple.

An organic light emitting member is formed on the insulating bank 361 and the pixel electrode 191.

The organic light emitting member may include an emitting layer 370 which emits light and an auxiliary layer (not shown) which improves emission efficiency of the emitting layer.

The emitting layer 370 may emit a white light. In one exemplary embodiment the white light emitting layer may be constructed by sequentially laminating materials emitting light such as a red color, green color, and blue color to form a plurality of a sub-emitting layer (not shown) and the white light is emitted by combining these colors. Exemplary embodiments include configurations wherein the sub-emitting layer may be formed vertically or horizontally. Furthermore, as long as the white light is emitted, various colors as well as the red color, green color, and blue color may be combined.

Exemplary embodiments of the emitting layer 370 may be made of a high molecular weight material or a low molecular weight material. Exemplary embodiments of the high molecular weight material may include, for example, polyfluorene derivatives, (poly)paraphenylenevinylene derivatives, polyphenylene derivatives, polyvinylcarbazole, and polythiophene derivatives. In addition, exemplary embodiments of the low molecular weight material may include anthracene such as 9,10-diphenylanthracene, butadiene such as tetraphenylbutadiene, tetracene, distyrylarylene derivatives, and benzazole derivatives and carbazole derivatives. The above-described high molecular weight material or low molecular weight material are referred to as a host material, and the emission efficiency of the host material may be increased by doping it with dopants. Exemplary embodiments of the dopants include xanthene, perylene, cumarine, rhodamine, rubrene, dicyanomethylenepyran compound, thiopyran compound, (thia)pyrilium compound, periflanthene derivatives, indenoperylene derivatives, carbostyryl compound, Nile red, quinacridone.

Exemplary embodiments of the auxiliary layer include an electron transport layer (not shown) and a hole transport layer (not shown) for adjusting balance of electrons and holes and an electron injecting layer (not shown) and a hole injecting layer (not shown) for reinforcing injection of the electrons and the holes. Moreover alternative exemplary embodiments include configurations wherein the auxiliary layer may include two or more of the abovementioned layers.

The hole transport layer and the hole injecting layer may be made of a material having a highest occupied molecular orbital ("HOMO") level between a work function of the pixel electrode 191 and a HOMO level of the emitting layer, and the electron transport layer and the electron injecting layer may be made of the material having a lowest unoccupied molecular orbital ("LUMO") level between a work function of the common electrode 270 and a LUMO level of the emitting layer.

Exemplary embodiments of the hole transport layer or the hole injecting layer include diamine, [4,4',4"-tris(3-methylphenyl)phenylamino]triphenylamine (MTDATA), N,N'-diphenyl-N,N'-di(3-methylphenyl)-1,1'-biphenyl-4,4'-diamine ("TPD"), 1,1-bis(4-di-p-tolylaminophenyl)cyclohexane),N,N,N',N'-tetra(2-naphthyl)-4,4-diamino-p-terphenyl, 4,4',4-tris[(3-methylphenyl)phenylamino]triphenylamine, polypyrrole, polyaniline, poly-(3,4-ethylenedioxythiophene: polystyrenesulfonate ("PEDOT:PSS").

A common electrode 270 is formed on the organic light emitting member 370. The common electrode 270 has a low work function and may be made of a metal having high reflectance, exemplary embodiments of which include Al, Au, Pt, Ni, Cu, W or alloys thereof. The common electrode 270 is formed over substantially the entire substrate and, when paired with the pixel electrode 191, allows the current to flow into the emitting layer 370.

Hereinafter, an exemplary embodiment of the white pixel W will be described.

The common electrode 270 generates a microcavity effect with the semi-transparent member 192. The microcavity effect amplifies light of a specified wavelength by repeatedly reflecting light toward a reflective layer and a semi-transparent layer which are spaced apart from each other by a predetermined distance. Here, the common electrode 270 serves as a reflective layer, and the semi-transparent member 192 serves as a semi-transparent layer.

The common electrode 270 forms the microcavity for improving the emission efficiency of light emitted from the emitting layer 370. The emission of light in the vicinity of the wavelength corresponding to a resonance wavelength of the microcavity is enhanced by the semi-transparent member 192, and light of others wavelength is restrained. In such an exemplary embodiment the enhancement and restraint of light having the specified wavelength may be determined depending on the distance between the common electrode 270 and the semi-transparent member 192. Therefore, light having the specified wavelength may be enhanced and restrained by controlling the thickness of the emitting layer 370 and the auxiliary layer (not shown).

According to this exemplary embodiment of the present invention, it is possible to improve a blue purity of the display by selectively emitting a white light which has been tuned towards the blue wavelengths from the emitting layer 370. For this reason, the limitation of the emission efficiency of the display due to the restraints in the light emitting materials, and specifically a constraint due to the low emission efficiency of a blue light emitting material, is overcome, and thereby a white light emitting layer which is not restrained by the efficiency of any individual component therein, may be obtained. While the current exemplary embodiment is described with respect to tuning the white light emitting layer and the semi-transparent members 192 to enhance the blue components of the white light alternative exemplary embodiments include configurations wherein the white light emitting layer and the semi-transparent members 192 may be tuned to enhance other components of the white light such as red components or green components.

At this time, as described above, a portion of the pixel electrode 191 is covered with the semi-transparent member 192, and the rest is exposed. Accordingly, the blue light may be emitted by the microcavity in the region at which the semi-transparent member 192 is formed, while the white light passes directly through the region at which the semi-transparent member 192 is not formed, that is, the region to which the pixel electrode 191 is exposed. At this time, since the white light passing through the pixel electrode 191 does not include the blue light reflected partially by the semi-transparent member 192, the white light has a yellowish tint due to the partial reduction of the blue light out of the white light. Finally, light emitted outside the substrate has a full white color by combination of the blue light and the yellowish white.

Where the microcavity effect is not present, if the same current is applied to the emitting layer including the red sub-emitting layer, and the green sub-emitting layer, which both have a high emission efficiency, and the blue sub-emitting layer which has a low emission efficiency, each sub-emitting layer emits a color having different color characteristics. Moreover, each sub-layer will emit a varying amount of light at a given voltage, and therefore the resulting light will be more heavily weighted towards color of the more efficient sub-emitting layer. Accordingly, it is difficult to emit a white light by combining the light from all three sub-layers. According to this exemplary embodiment of the present invention, the limitation of the emission efficiency due to the emitting materials is overcome, thereby obtaining a prescribed white light.

In the current exemplary embodiment of an organic light emitting device, the switching thin film transistor Qs is provided with the switching control electrode 124a connected to the gate line 121, the switching input electrode 173a connected to the data line 171 and the switching output electrode 175a connected with the driving control electrode 124b all of which are provided together with the switching semiconductor 154a. The channel of the switching TFT Qs is formed in the switching semiconductor 154a positioned between the switching input electrode 173a and the switching output electrode 175a. The driving thin film transistor Qd is provided with the driving control electrode 124a connected to the switching output electrode 175a, the driving input electrode 173b connected to the driving voltage line 172, and the driving output electrode 175b connected to the pixel electrode 191 all of which are provided together with the driving semiconductor 154b. The channel of the driving TFT Qd is formed in the driving semiconductor 154b positioned between the driving input electrode 173b and the driving output electrode 175b.

The organic light emitting diode is provided with the pixel electrode 191, the emitting layer 370, and the common electrode 270. At this time, the pixel electrode 191 functions as an anode, and the common electrode 270 functions as a cathode. In an alternative exemplary embodiment the pixel electrode 191 may function as the cathode, and the common electrode 270 may function as the anode.

As described above, in one exemplary embodiment the switching semiconductor 154a is made of amorphous semiconductor, and the driving semiconductor 154b is made of crystalline semiconductor. That is, in the current exemplary embodiment the channel of the switching TFT Qs is formed in the amorphous semiconductor, and the channel of the driving TFT Qd is formed in the crystalline semiconductor.

According to the current exemplary embodiment of the present invention, the channels of the switching TFT Qs and the driving TFT Qd are formed in the semiconductors having different crystal states, respectively. Therefore, it is possible to satisfy the individual, and different, characteristics required by each TFT.

If the channel of the driving TFT Qd is formed in the microcrystalline or polycrystalline semiconductor, it is possible to obtain a high carrier mobility and stability. Therefore, the amount of steady current flowing into the light emitting elements is increased, and the luminance is improved. In addition, if the channel of the driving TFT Qd is formed in the microcrystalline or polycrystalline semiconductor, it is possible to prevent a threshold voltage Vth shift. The threshold voltage Vth shift is a gradual change in the threshold voltage Vth which over time will degrade the image quality of the display by causing image sticking and the shift may ultimately shorten the lifetime of the display. The threshold voltage Vth shift is generated by continuously applying a positive voltage during the driving. Accordingly, the current exemplary embodiment may reduce or effectively prevent an image sticking and a lifetime shortening of the display device.

Meanwhile, since the switching TFT Qs controls the data voltage, on/off characteristics of the TFT Qs are important, and particularly, it is important to reduce the amount of current flowing through the TFT in an off current state. However, if the switching TFT Qs is made from the microcrystalline or polycrystalline semiconductor it will have a large off current and the voltage difference between the data voltage passing through the switching TFT Qs in an on and off state will be reduced. Therefore, a cross talk, which reduces image display quality, may be generated. Accordingly, in the current exemplary embodiment it is possible to prevent the reduction of the data voltage and reduce the cross talk by forming the switching TFT Qs with the amorphous semiconductor having a low off current.

According to this current exemplary embodiment of the present invention, one switching TFT Qs and one driving TFT Qd are shown, but alternative exemplary embodiments may further include at least one of the TFTs and a plurality of wiring lines for driving the TFT. For this reason, even when the organic light emitting device is driven for a long time, it is possible to prevent the lifetime of the organic light emitting device from being shortened by preventing or compensating the deterioration of the organic light emitting diode and the driving TFT Qd.

The above-described exemplary embodiments of the present invention have illustratively explained a bottom emission structure which transmits light emitted from the emitting layer 370 toward the substrate 110. However, exemplary embodiments configured with a top emission structure which transmits light emitted from the emitting layer 370 toward the common electrode 270 may be used. In such exemplary embodiments, the pixel electrode 191 may be made of an opaque conductor such as Al, Au, Pt, Ni, Cu, W or an alloy thereof, and the common electrode may be made of a transparent conductor such as ITO or IZO. In addition, in exemplary embodiments configured with the top emission structure, the color filter 230B, and the red and green color filters (not shown) are located at the upper surface of the emitting layer 370.

Next, an exemplary embodiment of a method of fabricating the exemplary embodiment of an organic light emitting device shown in FIG. 2 to FIG. 5 will be described in detail with reference to FIG. 7 to FIG. 23.

Figure 10:
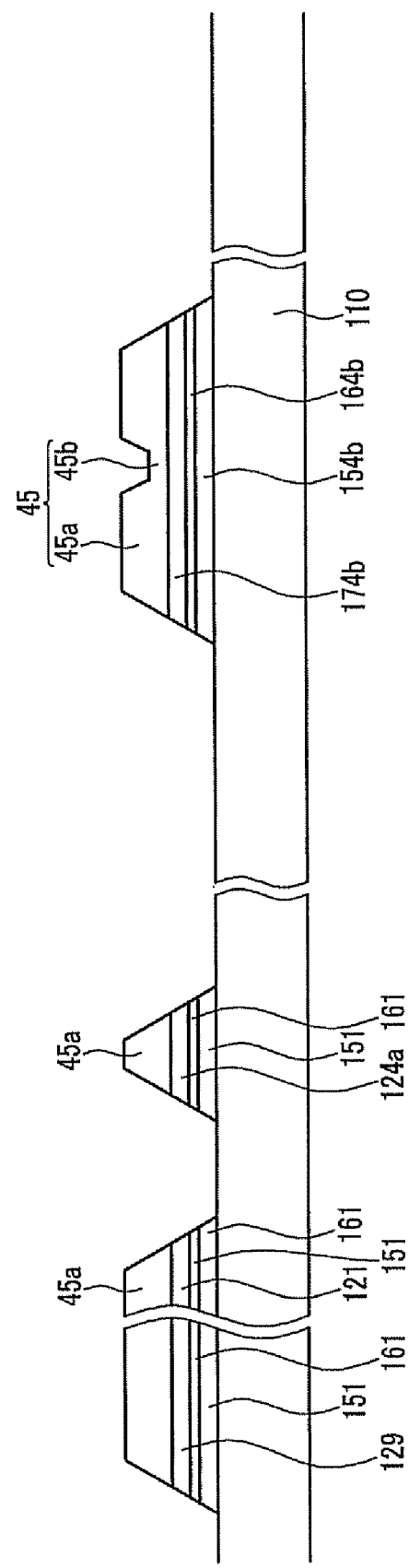
Figure 11:
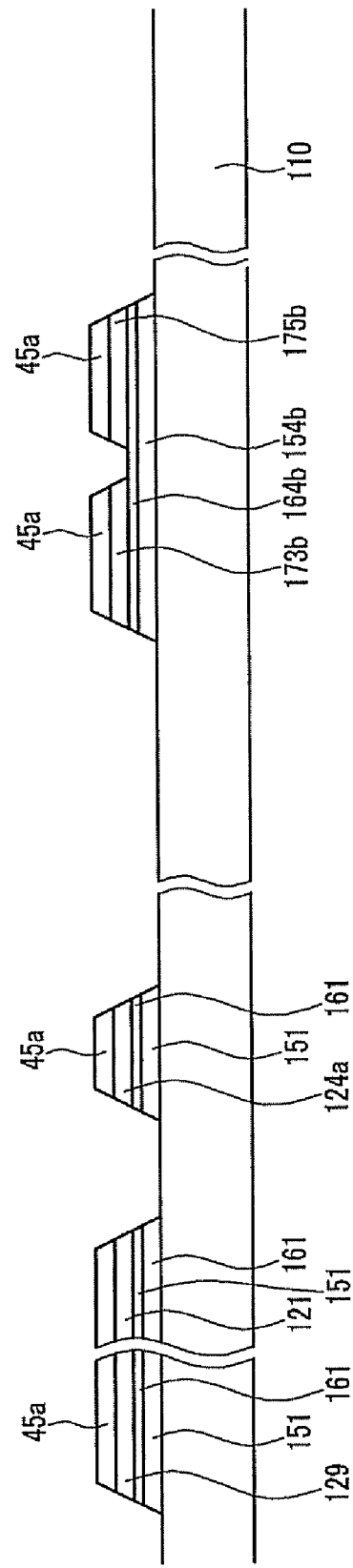
Figure 12:
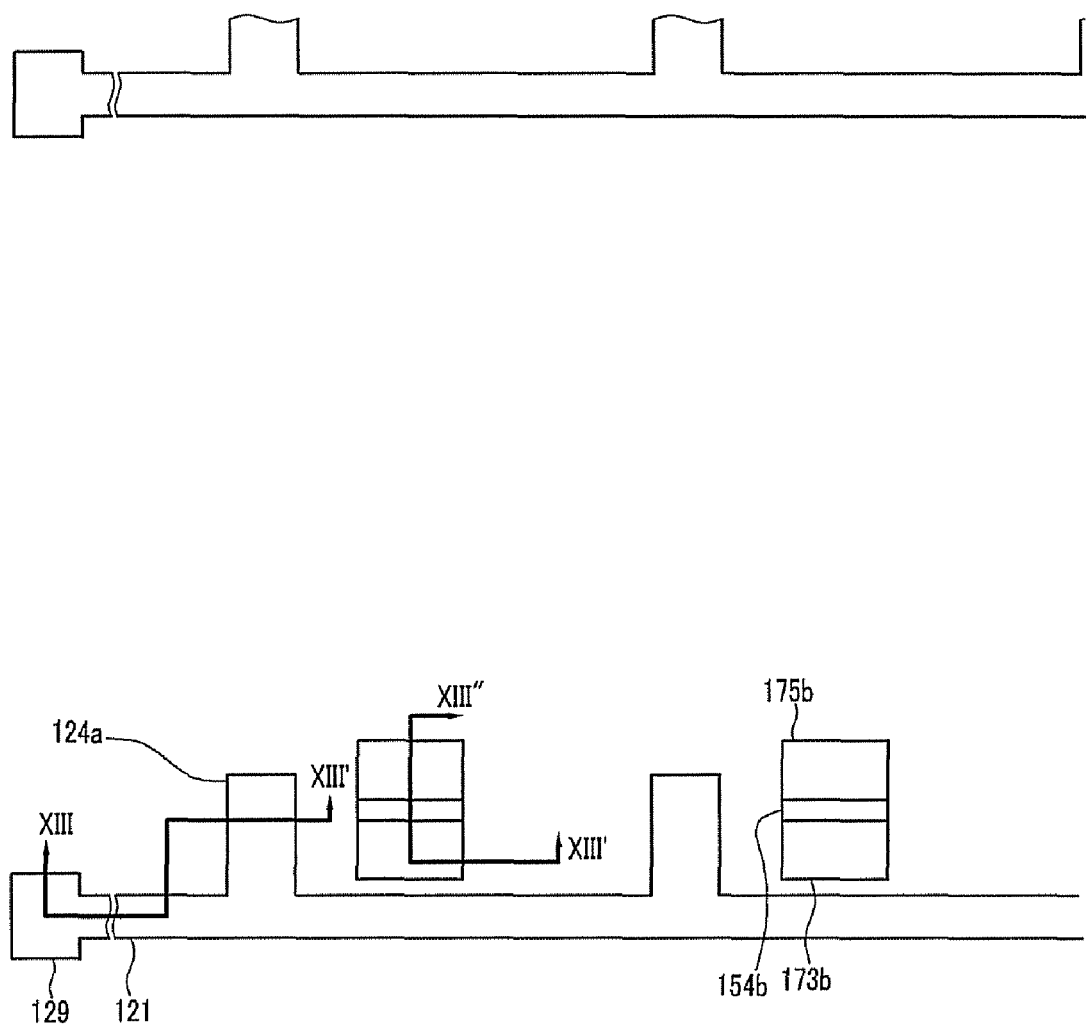
FIG. 12, FIG. 14, FIG. 16, FIG. 19 and FIG. 22 are top plan view layouts sequentially showing a method of fabricating the exemplary embodiment of an organic light emitting device according to the present invention.
Figure 13:
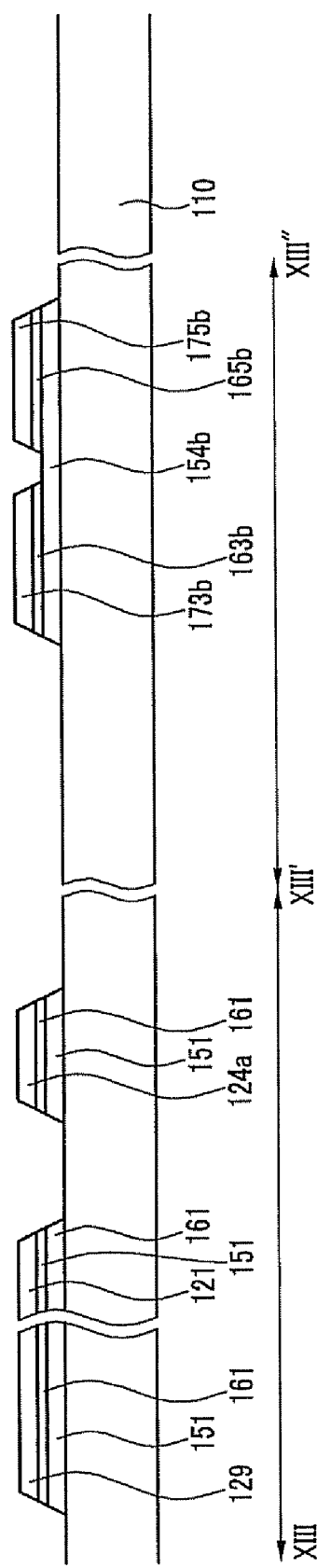
FIG. 13 is a cross-sectional view taken along line XIII-XIII'-XIII" of FIG. 12.
Figure 14:
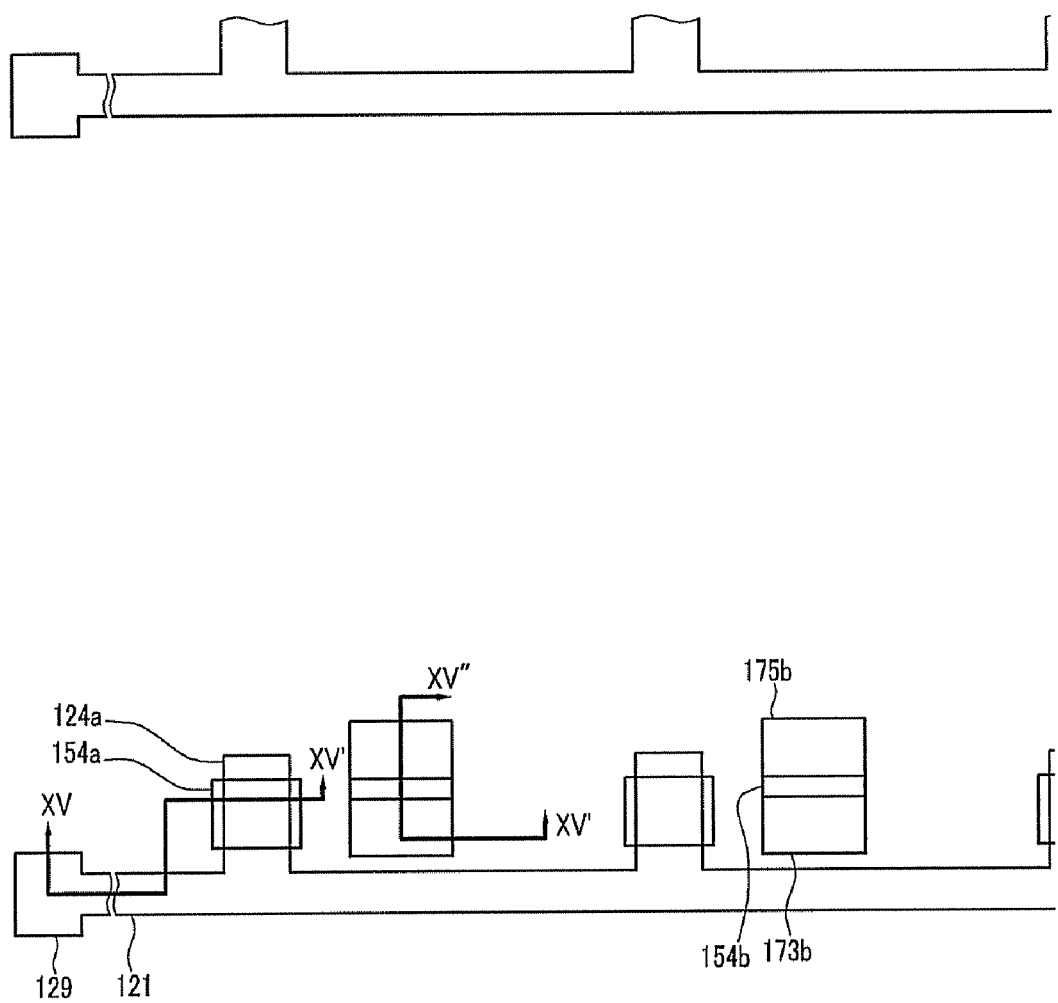
Figure 15:
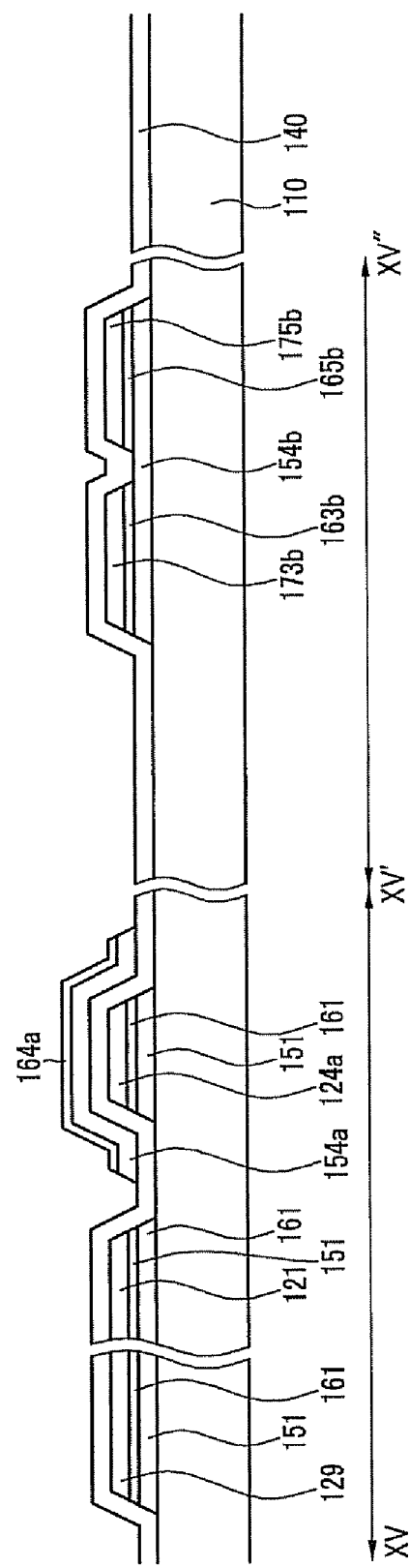
FIG. 15 is a cross-sectional view taken along line XV-XV'-XV" of FIG. 14.
Figure 16:
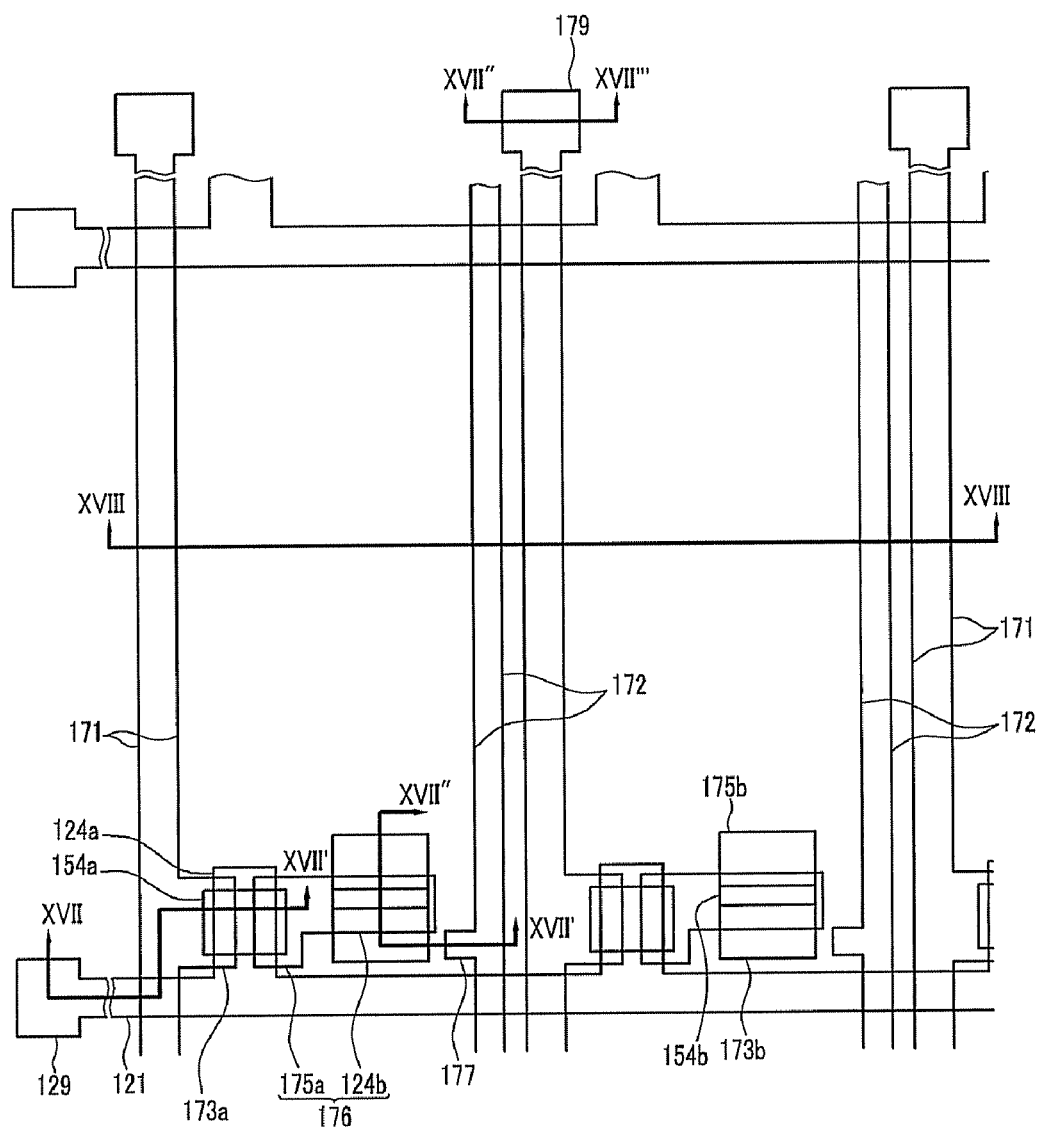
Figure 17:
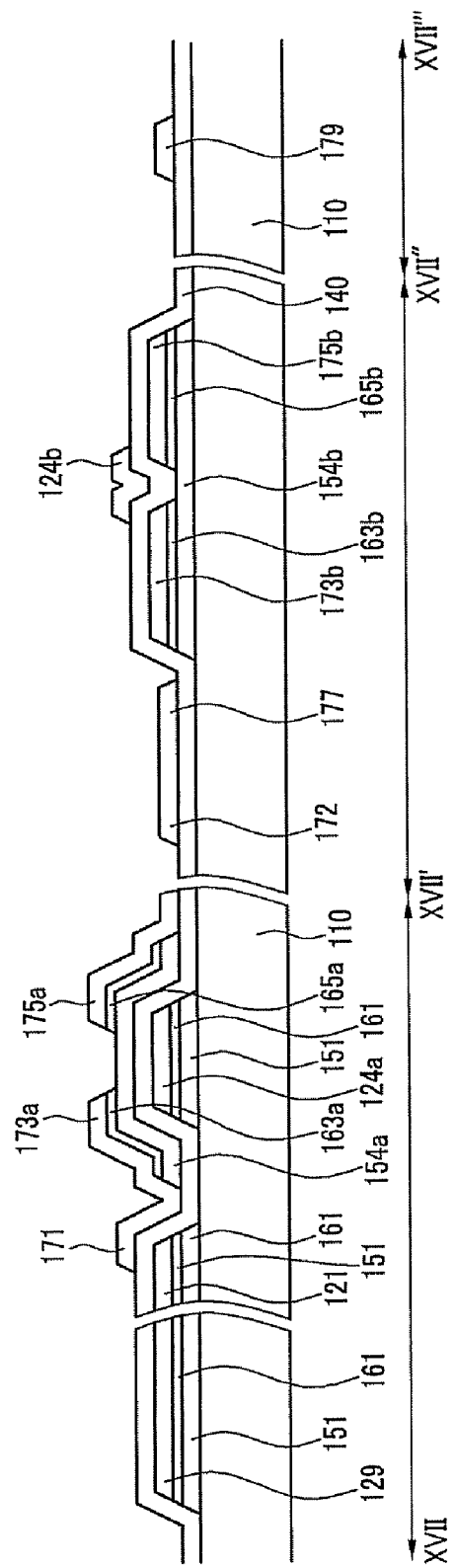
FIG. 17 and FIG. 18 are cross-sectional views taken along lines XVII-XVII'-XVII"-XVII'" and XVIII-XVIII of FIG. 16, respectively.
Figure 18:
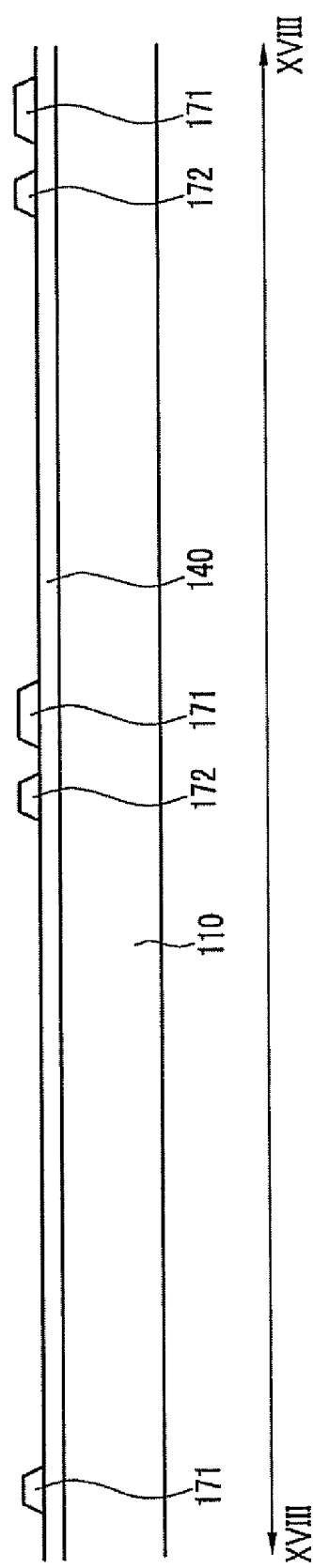
Figure 19:
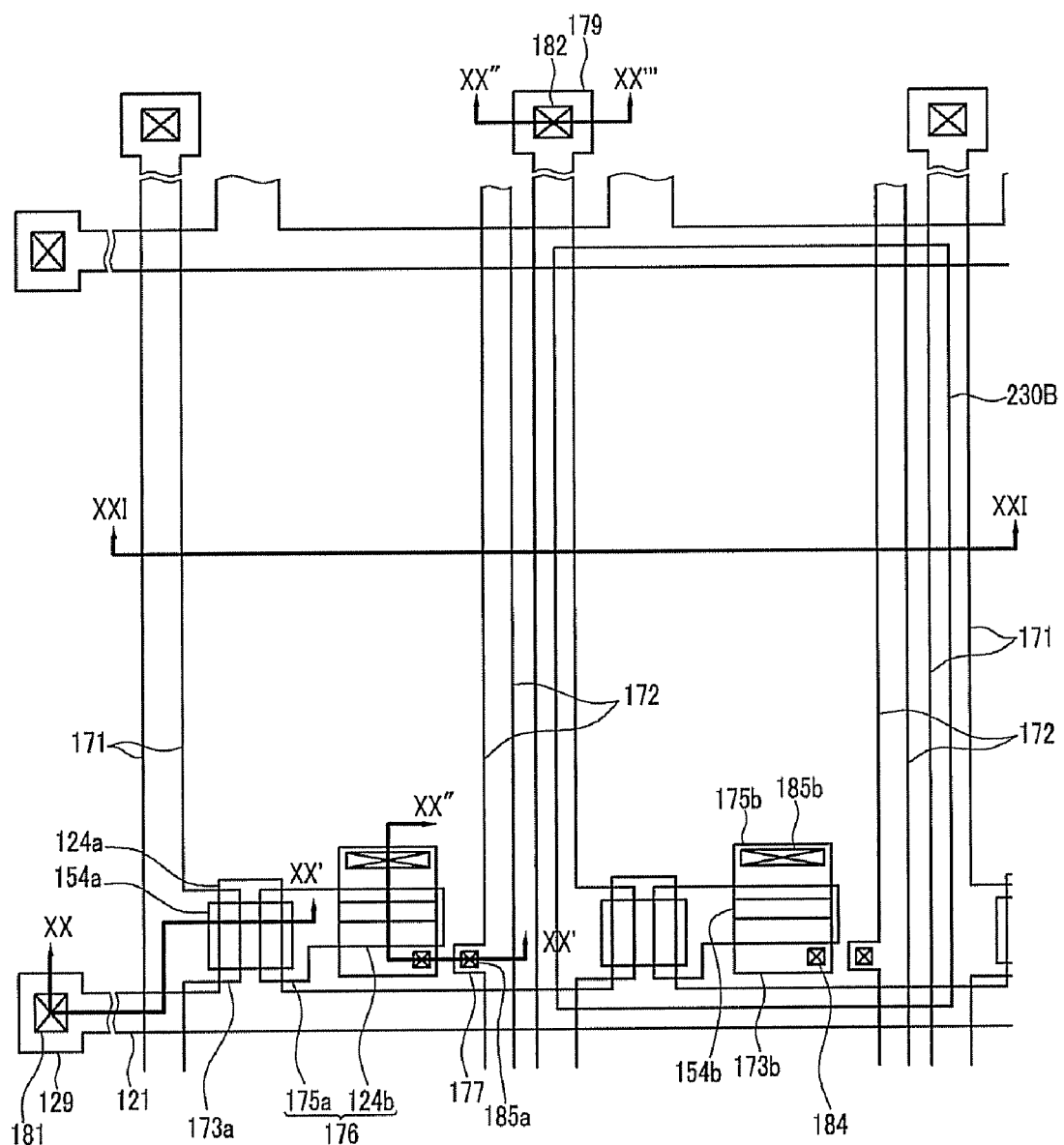
Figure 20:
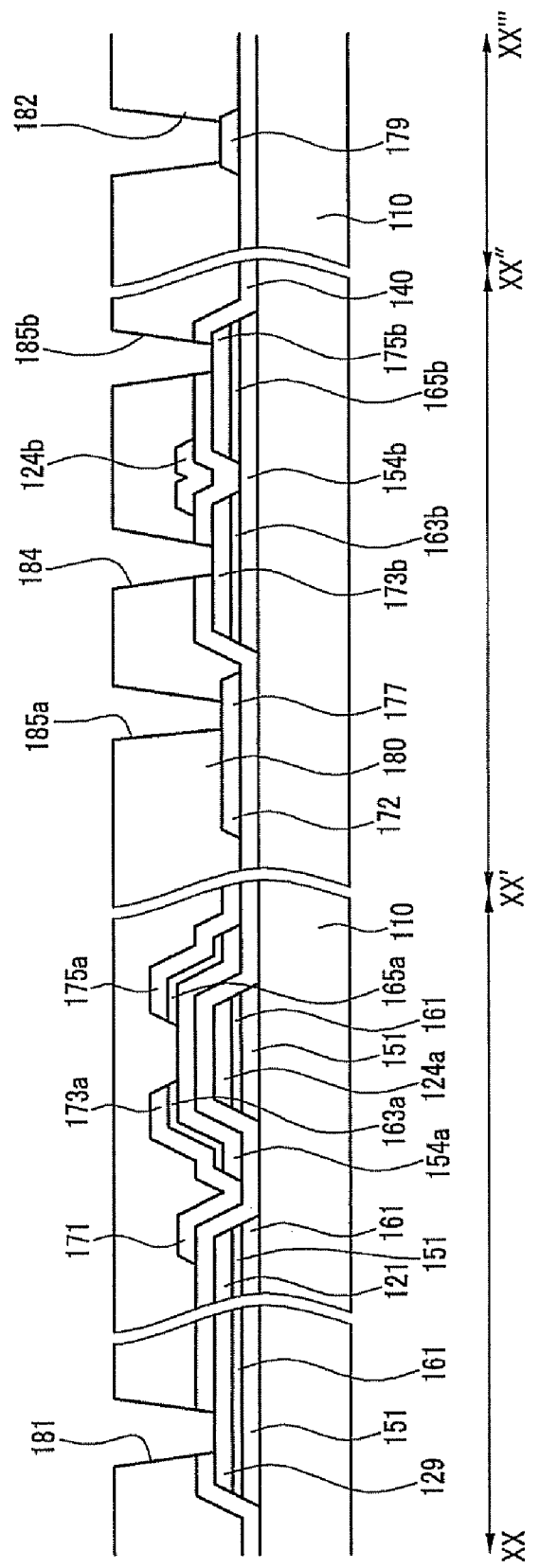
FIG. 20 and FIG. 21 are cross-sectional views taken along lines XX-XX'-XX"-XX'" and XXI-XXI of FIG. 19, respectively.
Figure 21:
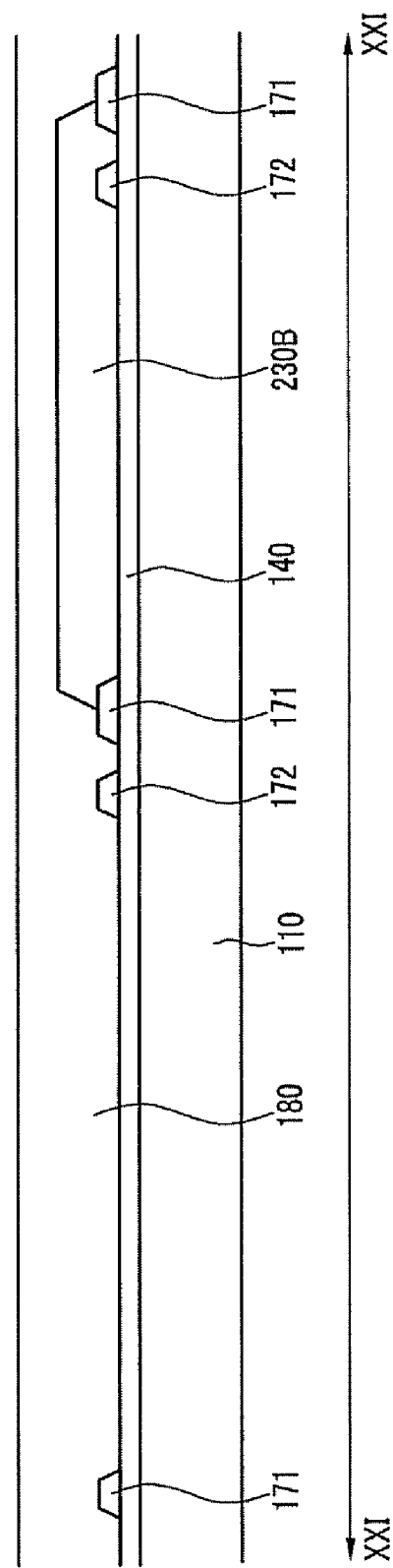
Figure 22:
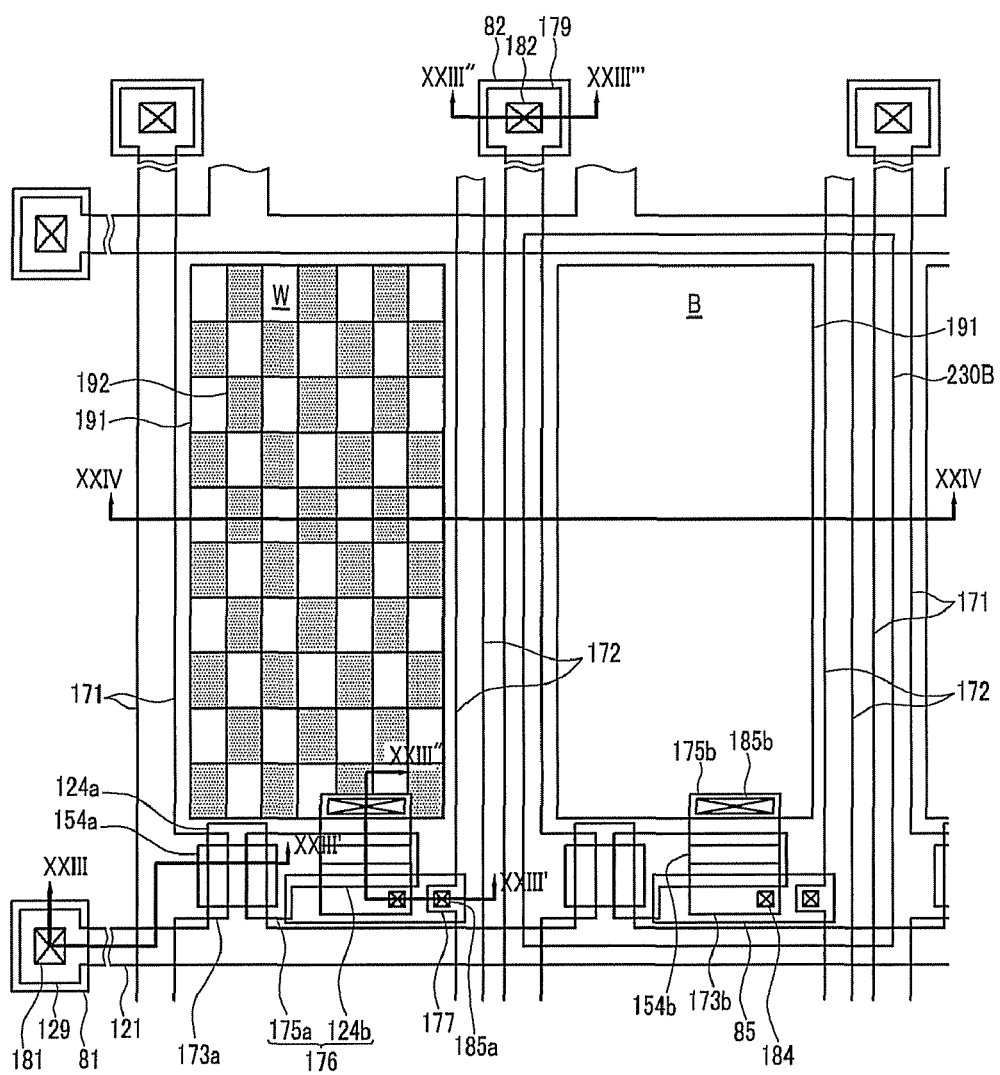
Figure 23:
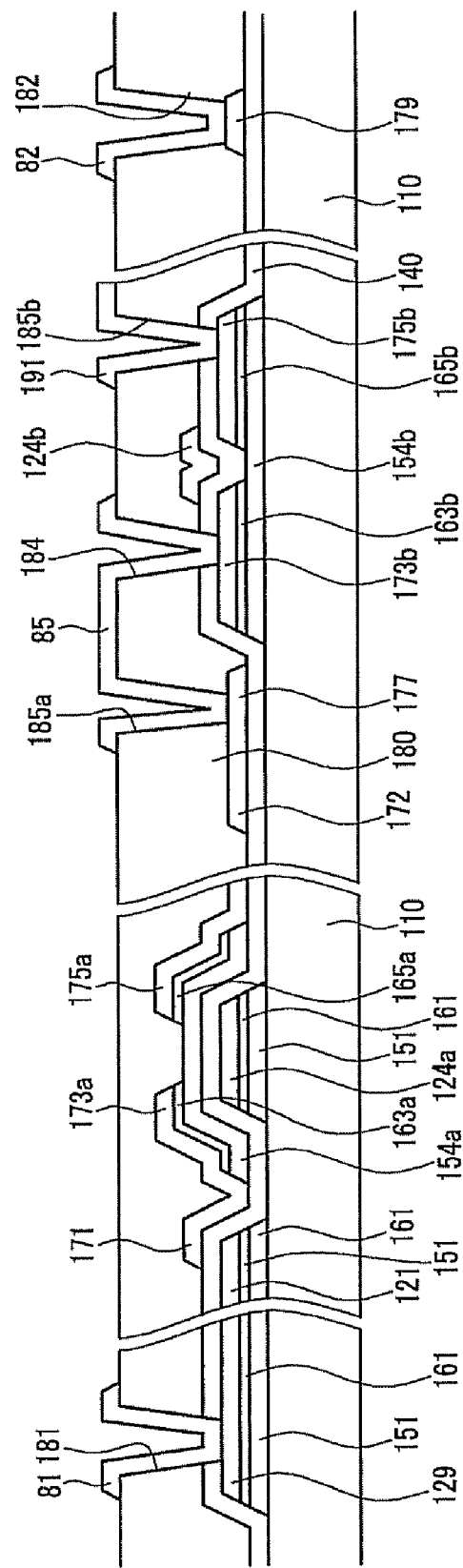
FIG. 23 and FIG. 24 are cross-sectional views taken along lines XXIII-XXIII'-XXIII"-XXIII'" and XXIV-XXIV of FIG. 22, respectively.
Figure 24:
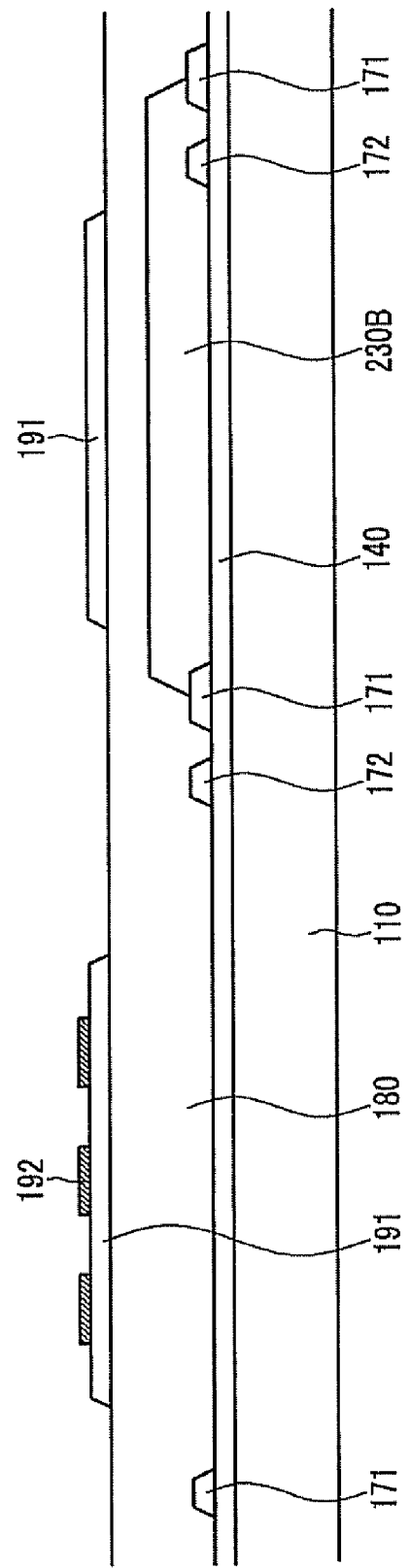
Figure 25:
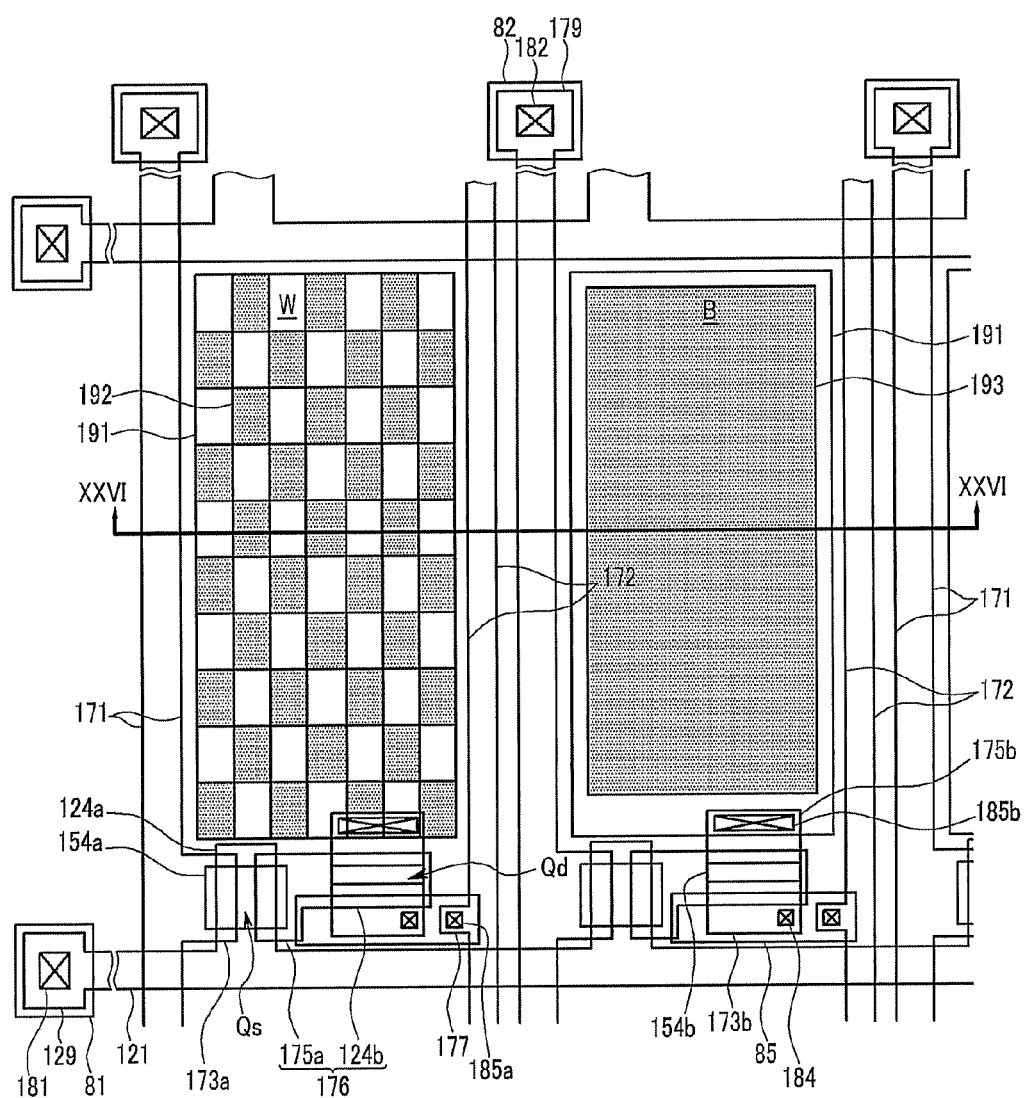
FIG. 25 is a top plan view layout of another exemplary embodiment of an organic light emitting device according to the present invention.
Figure 26:
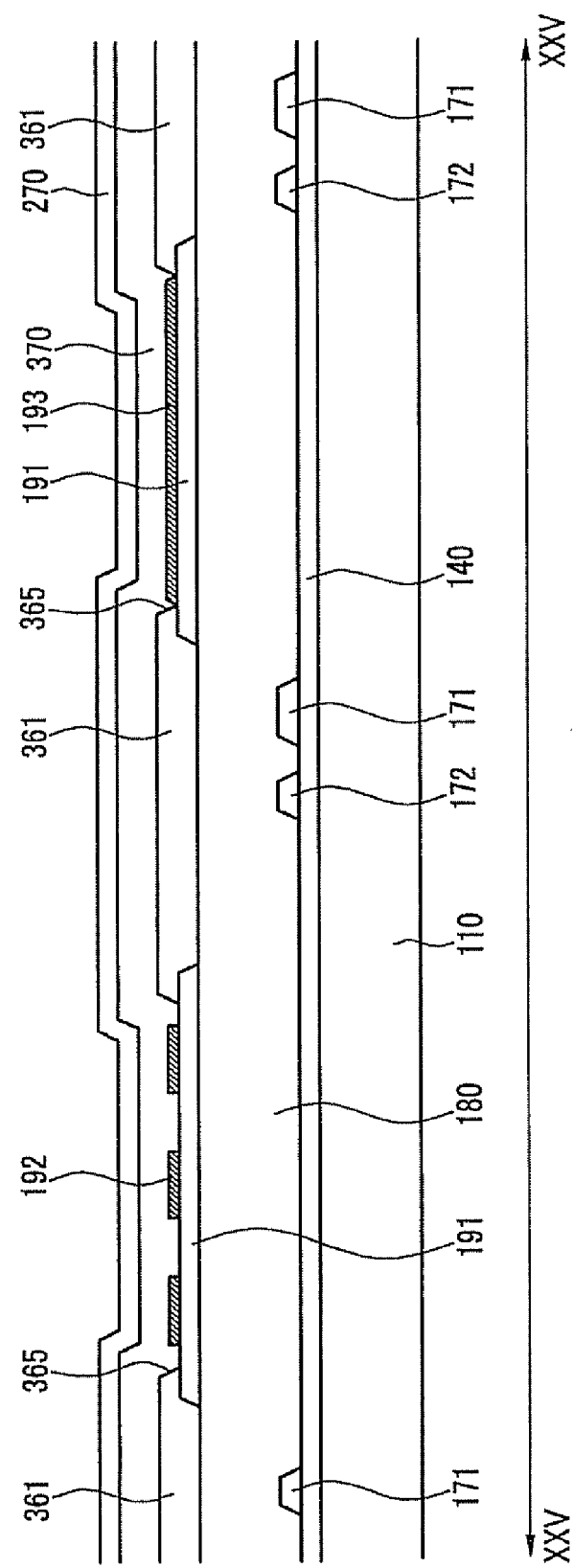
FIG. 26 is a cross-sectional view taken along line XXVI-XXVI of FIG. 25.

FIGS. 7 to 11 are cross-sectional views sequentially showing one exemplary embodiment of a method of fabricating the exemplary embodiment of an organic light emitting device according to the present invention, FIG. 12, FIG. 14, FIG. 16, FIG. 19 and FIG. 22 are top plan view layouts sequentially showing one exemplary embodiment of a method of fabricating an exemplary embodiment of the organic light emitting device according to the present invention, FIG. 13 is a cross-sectional view taken along line XIII-XIII'-XIII" of FIG. 12, FIG. 15 is a cross-sectional view taken along line XV-XV'-XV" of FIG. 14, FIG. 17 and FIG. 18 are cross-sectional views taken along lines XVII-XVII'-XVII"-XVII'" and XVIII-XVIII of FIG. 16, respectively, FIG. 20 and FIG. 21 are cross-sectional views taken along lines XX-XX'-XX"-XX'" and XXI-XXI of FIG. 19, respectively, FIG. 23 and FIG. 24 are cross-sectional views taken along lines XXIII-XXIII'-XXIII"-XXIII'" and XXIV-XXIV of FIG. 22, respectively, FIG. 25 is a top plan view layout of an exemplary embodiment of an organic light emitting device according to the present invention, and FIG. 26 is a cross-sectional view taken along line XXVI-XXVI of FIG. 25.

Figure 7:
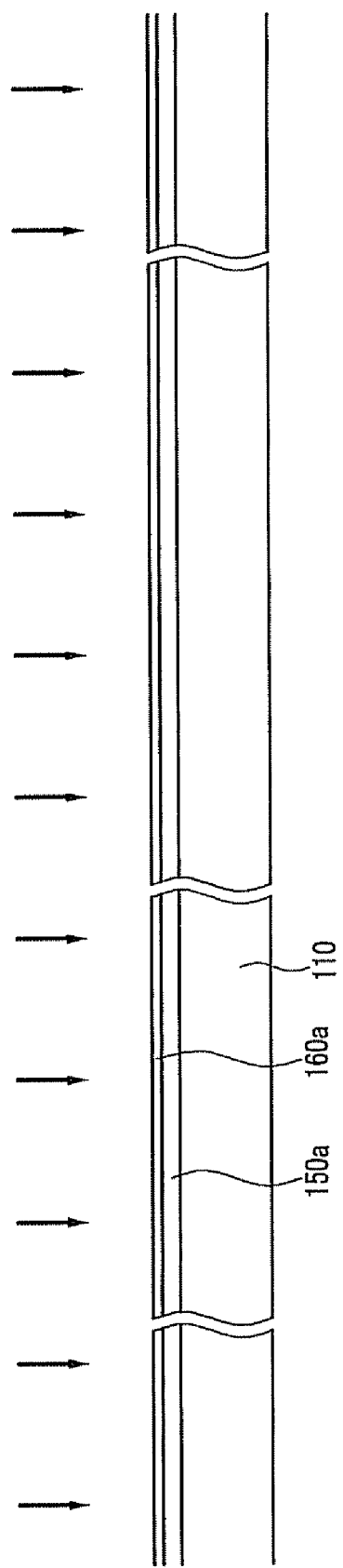
FIGS. 7 to 11 are cross-sectional views sequentially showing a method of fabricating the exemplary embodiment of an organic light emitting device according to the present invention.
Figure 8:
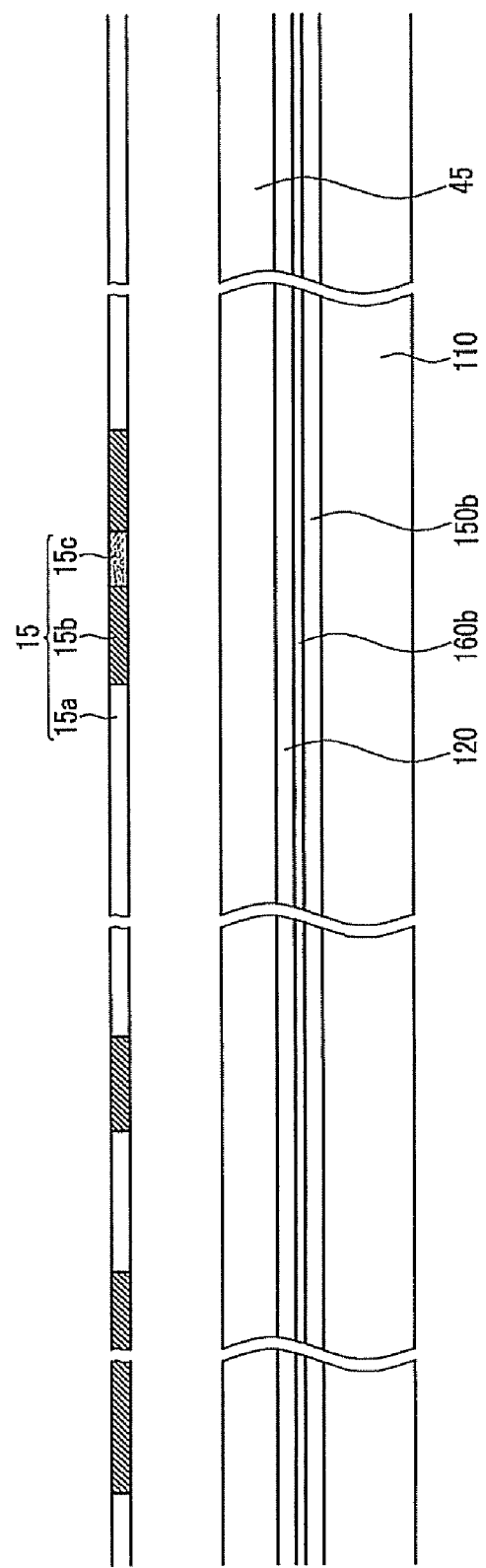

First, as shown in FIG. 7 and FIG. 8, an amorphous silicon layer 150a and an impurity-doped amorphous silicon layer 160a are sequentially laminated on the insulating substrate 110.

Next, a polycrystalline silicon layer 150b and an impurity-doped polycrystalline silicon layer 160b are formed by crystallizing the amorphous silicon layer 150a and the impurity-doped amorphous silicon layer 160a, respectively. Exemplary embodiments of the crystallization may be performed by processes such as solid phase crystallization ("SPC"), a rapid thermal annealing ("RTA"), a liquid phase recrystallization ("LPR"), or an excimer laser annealing ("ELA"). One exemplary embodiment uses the SPC process.

Next, a conductive layer 120, exemplary embodiments of which are made of an Al-containing metal, is laminated on the impurity-doped polycrystalline silicon layer 160b, and a photoresist layer 45 is applied on the conductive layer 120.

Then, a mask 15 having a light transmitting region 15a, a light shielding region 15b, and a light semi-transmitting region 15c is disposed above the photoresist layer 45. Exemplary embodiments of the semi-transmitting region 15c include a slit pattern, a lattice pattern, or a thin film having intermediate transmittance or intermediate thickness. In one exemplary embodiment wherein the slit pattern is used, the width of the slit or the interval between the slits is smaller than resolution of an exposure device used in the photo process.

Figure 9:
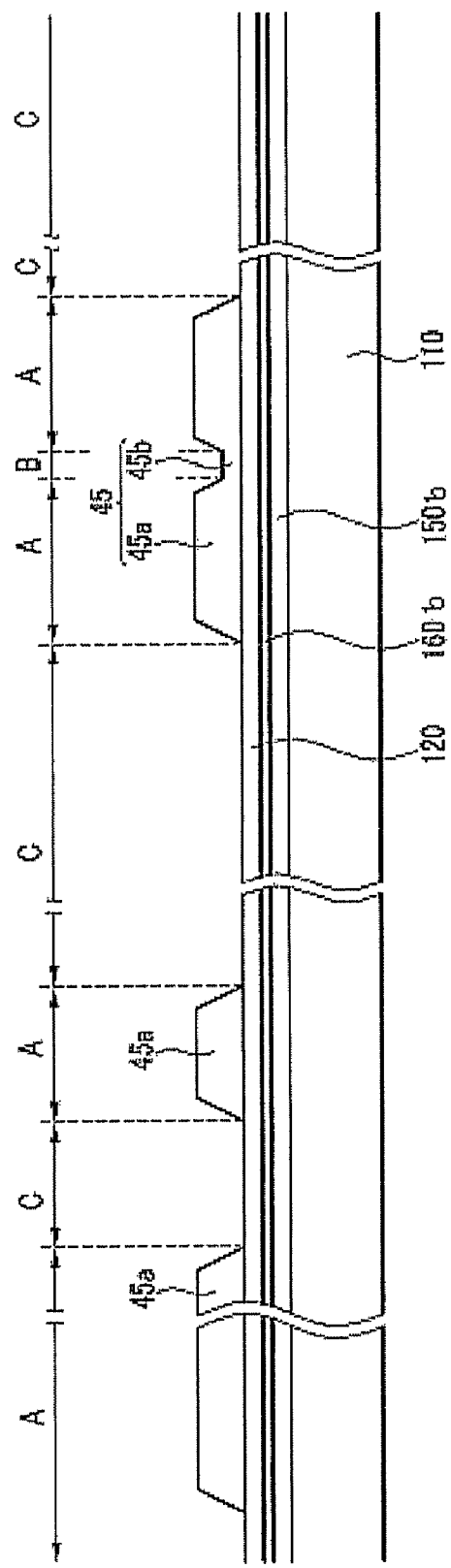

Next, as shown in FIG. 9, a first photoresist pattern 45a and a second photoresist pattern 45b, which is thinner than the first photoresist pattern 45a, are formed by exposing and developing the photoresist layer 45.

For convenience of description, the organic light emitting device may be divided into an electrode region (A), a channel region (B), and a remaining region (C) which is substantially any region other than the electrode region (A) and the channel region (B). The gate line 121, the driving input electrode 173b, and the driving output electrode 175b are formed within the electrode regions (A). Moreover, a channel is formed on the driving semiconductor 154b at the channel region (B).

The first photoresist pattern 45a located at the electrode region (A) is formed so as to be thicker than the second photoresist pattern 45b located at the channel region (B), and the photoresist layer located at the remaining region (C) is completely removed. At this time, the ratio of the thickness of the first photoresist pattern 45a and thickness of the second photoresist pattern 45b is different depending on process conditions in an etching process to be described later. However, in one exemplary embodiment the thickness of the second photoresist pattern 45b is set to about ½ or less of that of the first photoresist pattern 45a.

Next, as shown in FIG. 10, the conductive layer 120 exposed in the remaining region (C) is wet etched using the first photoresist pattern 45a and the second photoresist pattern 45b as a mask. The gate line 121 including the switching control electrode 124a and the end portion 129 and the conductive member 174b are formed by the wet etching of the conductive layer 120.

Then, the polycrystalline silicon layer 150b and the impurity-doped polycrystalline silicon layer 160b which are exposed in the remaining region (C) are dry etched using the gate line 121 and the conductive member 174b as a mask. The linear semiconductor member 151, the driving semiconductor 154b, the impurity-doped linear semiconductor member 161, and the ohmic contact layer 164b are formed by the dry etching of the polycrystalline silicon layer 150b and the impurity-doped polycrystalline silicon layer 160b. At this time, the linear semiconductor member 151 and the impurity-doped linear semiconductor member 161 are formed so as to have substantially the same planar shape as the gate line 121. In addition, the driving semiconductor 154b and the ohmic contact layer 164b are formed so as to have substantially the same planar shape as the conductive member 174b.

Next, as shown in FIG. 11, the second photoresist pattern 45b of the channel portion B is removed using an etch back process, exemplary embodiments of which include an ashing process. At this time the thickness of the first photoresist pattern 45a is reduced by an amount substantially equal to the thickness of the second photoresist pattern 45b.

Also as a result of removing the second photoresist pattern 45b the conductive member 174b is divided into the driving input electrode 173b and the driving output electrode 175b, and the ohmic contact layer 164b is exposed to the channel between the driving input electrode 173b and the driving output electrode 175b.

As shown in FIG. 12 and FIG. 13, the remaining portions of the first photoresist pattern 45a are removed, and the ohmic contact layer 164b is dry etched using the driving input electrode 173b and the driving output electrode 175b as a mask, thereby forming a pair of ohmic contacts 163b and 165b by the dry etching of the ohmic contact layer 164b.

Next, as shown in FIG. 14 and FIG. 15, a gate insulating layer 140 is formed on the insulating substrate 110, the signal lines. Then an intrinsic amorphous silicon layer, and an impurity-doped amorphous silicon layer are continuously laminated on the gate line 121, the driving input electrode 173b, and the driving output electrode 175b, and then the switching semiconductor 154a and ohmic contact layer 164a are formed by photolithographing the intrinsic amorphous silicon layer and the impurity-doped amorphous silicon layer.

As shown in FIG. 16 to FIG. 18, a conductive layer is laminated on the gate insulating layer 140 and the ohmic contact layer 164a, and then the data line 171 including the switching input electrode 173a and the end portion 179, the driving voltage line 172 and the electrode member 176 are formed by the photolithography process. The electrode member 176 includes the switching output electrode 175a and the driving control electrode 124b.

Next, the ohmic contact layer 164a is etched using the switching input electrode 173a and the switching output electrode 175a as a mask, thereby forming a pair of ohmic contacts 163a and 165a by the etching of the ohmic contact layer 164a. The etching of the ohmic contact layer 164a also exposes a portion of the switching semiconductor 154a.

Then, as shown in FIG. 19 to FIG. 21, the color filter 230B is formed on the data line 171, the driving voltage line 172, the electrode member 176, the exposed switching semiconductor 154a, and the gate insulating layer 140. The color filter forms a red color filter in the red pixel R, a green color filter in the green pixel G, and a blue color filter in the blue pixel B depending on the arrangement of the pixels one exemplary embodiment of which is shown in FIG. 2. Moreover, a separate color filter is not formed in the white pixel W, and a transparent insulating layer may be formed in the white pixel W.

Then, a passivation layer 180 is laminated on the color filter 230B and also on the other color filters (not shown) and above the white pixel. A plurality of contact holes 181, 182, 184, 185a, and 185b are formed by the photolithography process in the passivation layer 180 and the gate insulating layer 140.

Next, as shown in FIG. 22 to FIG. 24, a plurality of pixel electrodes 191, the connection member 85 and a plurality of contact assistants 81 and 82 are formed on the passivation layer 180 by conducting a photolithography process after depositing a transparent conductive layer, exemplary embodiments of which include ITO or IZO.

The semi-transparent member 192 is formed on the pixel electrode 191 of the white pixel W.

Next, as shown in FIG. 3 through FIG. 5, the insulating bank 361 having a plurality of openings 365 is formed on the pixel electrode 191, the semi-transparent member 192, the connection member 85, the plurality of contact assistants 81 and 82, and the passivation layer 180 by exposing and subsequently developing a photoresist layer.

Then, a plurality of auxiliary layers (not shown) and the emitting layer 370 are sequentially formed. In one exemplary embodiment the auxiliary layers and the emitting layer 370 may be formed by a process such as deposition or inkjet printing.

Finally, the common electrode 270 is formed on the insulating bank 361 and the emitting layer 370.

An exemplary embodiment of an organic light emitting device according to the present invention will be described hereinafter with reference to FIG. 25 and FIG. 26.

FIG. 25 is a top plan view layout of another exemplary embodiment of an organic light emitting device according to the present invention, and FIG. 26 is a cross-sectional view taken along line XXVI-XXVI of FIG. 25, The organic light emitting device according to this exemplary embodiment of the present invention is approximately similar to that of the above-described embodiment except for the color filter and the organic light emitting diode.

That is, a plurality of driving semiconductors 154b and a plurality of linear semiconductor members 151 are formed on the insulating substrate 110 made of the crystalline semiconductor material exemplary embodiments of which include the microcrystalline silicon or polycrystalline silicon.

A plurality of gate lines 121, a plurality of driving input electrodes 173b, and a plurality of driving output electrodes 175b are formed on the driving semiconductors 154b and linear semiconductor members 151.

The ohmic contacts 163b and 165b are formed between the driving semiconductors 154b and the driving input electrodes 173b and between the driving semiconductors 154b and the driving output electrodes 175b, respectively. In addition, the impurity-doped linear semiconductor members 161 are formed between the gate lines 121 and the linear semiconductor members 151.

The gate insulating layer 140 is formed on the gate lines 121, the driving input electrodes 173b, and the driving output electrode 175b, and a plurality of switching semiconductors 154a made of hydrogenated amorphous silicon are formed on the gate insulating layer 140.

The data lines 171 including the switching input electrode 173a, the driving voltage lines 172 including the projection 177, and the electrode members 176 including the switching output electrode 175a and the driving control electrode 124b are formed on the switching semiconductors 154a and the gate insulating layer 140.

The ohmic contacts 163a and 165a are formed between the switching semiconductors 154a and the switching input electrodes 173a and between the switching semiconductors 154a and the switching output electrodes 175a, respectively.

The color filter is formed on the data lines 171, the driving voltage lines 172, and the electrode members 176. At this time, unlike the previously-described exemplary embodiment, the color filter is formed in only the red pixel R and the green pixel G. The white pixel W either does not include the color filter or includes a transparent filter (not shown), and the blue pixel B does not include the color filter.

The passivation layer 180 having a plurality of contact holes 181, 192, 184, 185a, and 185b is formed on the data lines 171, the driving voltage lines 172, and the electrode members 176.

A plurality of pixel electrodes 191, a plurality of connection members 85, and a plurality of contact assistants 81 and 82 are formed on the passivation layer 180.

Semi-transparent members 192 and 193 are formed on the pixel electrode 191 of the white pixel W and the blue pixel B, respectively. Similar to the above-described exemplary embodiment, the semi-transparent member 192 of the white pixel W is formed only on a portion of the region through which light emitted from an emitting layer 370 passes, and the pixel electrode 191 is exposed to the remaining region. Meanwhile, the semi-transparent member 193 of the blue pixel B is formed on substantially the entire region through which light emitted from an emitting layer 370 passes.

According to this exemplary embodiment of the present invention, the semi-transparent members 192 and 193 are located on the pixel electrode 191, but other exemplary embodiments include configurations wherein the semi-transparent member may be located under the pixel electrode 191.

The red pixel R and the green pixel G do not include the semi-transparent members 192 and 193.

The insulating bank 361 is formed on the pixel electrode 191, the semi-transparent members 192 and 193, the connection member 85, and the contact assistants 81 and 82. The insulating bank 361 defines the opening 365.

A plurality of sub-emitting layers (not shown) are sequentially laminated on the insulating bank 361 and the pixel electrode 191, the emitting layer 370 emitting the white light is formed on the sub-emitting layer, and the common electrode 270 is formed on the emitting layer 370.

The white pixel W of this exemplary embodiment is substantially similar to that of the above-described exemplary embodiment. That is, in the area at which the semi-transparent member 192 is formed, the blue light may be emitted from the emitting layer 370 by the microcavity effect generated between the common electrode 270 and the semi-transparent member 192. In the area at which the semi-transparent member 192 is not formed, the yellowish white light may be directly emitted through the pixel electrode 191. Therefore, the full white light may be emitted by the combination of the blue light and the yellowish white light as described above.

Unlike the above-described exemplary embodiment, the blue pixel B does not also include a color filter in this exemplary embodiment. The blue pixel B may emit the blue light from the emitting layer 370 by the microcavity effect generated between the common electrode 270 and the semi-transparent member 193. The semi-transparent layer 193 of the blue pixel B is formed over substantially the entire light emitting surface of the blue pixel in order to emit only the blue light. Accordingly, the blue light having high color purity may be emitted without a separate color filter.

According to the above-described exemplary embodiments, it is assumed that the blue light emitting material has the lowest emission efficiency among the red, green, and blue light emitting materials. However, in alternative exemplary embodiments wherein the emission efficiency of the red and green light emitting materials is relatively low, the use of a semitransparent member utilizing the microcavity phenomenon may be applicable to the red pixel or the green pixel in a similar manner. In addition, even when the white light is generated by combining colors other than the red, green, and blue colors, it may be applicable in the same manner by taking the emission efficiency of individual colors into consideration.

Another exemplary embodiment of the present invention will be described hereinafter.

This exemplary embodiment presents the structure of an organic light emitting device capable of improving the color purity of a specific light by using the above-described microcavity effect.

Figure 27:
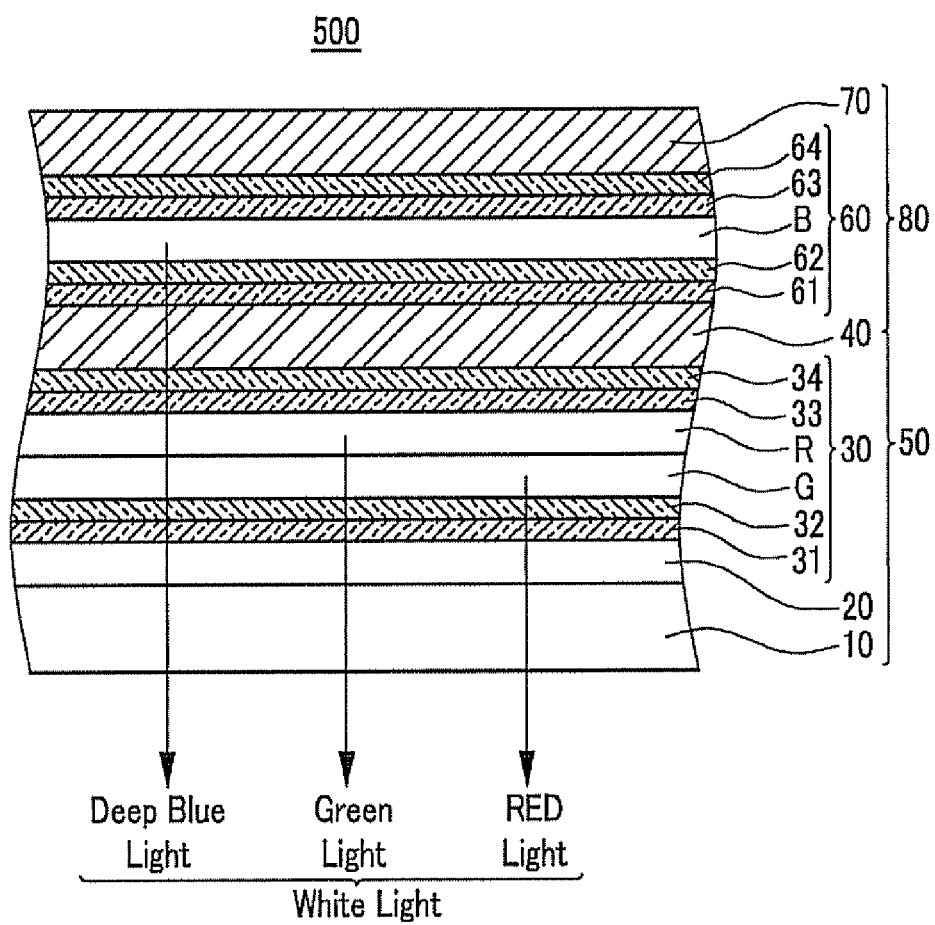
FIG. 27 is a schematic view showing another exemplary embodiment of the organic light emitting device according to the present invention.

FIG. 27 is a schematic view showing another exemplary embodiment of an organic light emitting device according to the present invention.

Referring to FIG. 27, the organic light emitting device 500 includes a transparent substrate 10, a lower electrode 20, a first organic light emitting member 30, an intermediate electrode 40, a second organic light emitting member 60, and an upper electrode 70.

The lower electrode 20 is formed on the transparent substrate 10 and is made of transparently conductive materials. In one exemplary embodiment the lower electrode 20 may be made of ITO or IZO.

The first organic light emitting member 30 includes a green emitting layer G and a red emitting layer R laminated on the lower electrode 20. In one exemplary embodiment the red emitting layer R is laminated on the green emitting layer G. In one exemplary embodiment the first organic light emitting member 30 may further include a hole injecting layer 31 and a hole transport layer 32 located between the green emitting layer G and the lower electrode 20.

Meanwhile, alternative exemplary embodiments include configurations wherein a laminating sequence of the red emitting layer R and the green emitting layer G may be changed, and the thickness of the red emitting layer R and the green emitting layer G may different to each other.

The intermediate electrode 40 is formed on the organic light emitting member 30 and is made of a semi-transparent metal. The intermediate electrode 40 may be formed so as to be semi-transparent by thinly depositing a metal layer.

In one exemplary embodiment the intermediate electrode 40 may be made of materials having a work function smaller than the lower electrode 20.

In one exemplary embodiment the first organic light emitting member 30 may further include an electron transport layer 33 and an electron injecting layer 34 located between the red emitting layer R and the intermediate electrode 40.

A first organic light emitting element 50 includes the lower electrode 20, the first organic light emitting member 30, and the intermediate electrode 40.

The lower electrode 20 functions as an anode of the first organic light emitting element 50. The lower electrode 20 receives voltage to provide holes into the first organic light emitting member 30.

The intermediate electrode 40 functions as a cathode of the first organic light emitting element 50. The intermediate electrode 40 receives the voltage to inject electrons into the first organic light emitting member 30.

The second organic light emitting member 60 including a blue emitting layer B is formed on the intermediate electrode 40. The second organic light emitting member 60 may further include a hole injecting layer 61 and a hole transporting layer 62 located between the blue emitting layer B and the intermediate layer 40.

The upper electrode 70 is formed on the second organic light emitting member 60. The upper electrode 70 may be made of a conductor capable of reflecting light. In one exemplary embodiment the upper electrode 70 may be made of materials having a work function smaller than the intermediate electrode 40.

The second organic light emitting member 60 may further include an electron transport layer 63 and an electron injecting layer 64 located between the blue emitting layer B and the upper electrode 70.

A second organic light emitting element 80 includes the intermediate electrode 40, the second organic light emitting member 60, and the upper electrode 70.

The intermediate electrode 40 functions as an anode of the second organic light emitting element 80. The intermediate electrode 40 receives the voltage to provide holes into the second organic light emitting member 60. The upper electrode 70 functions a cathode of the second organic light emitting element 80. The upper electrode 70 receives the voltage to provide electrons into the second organic light emitting member 60.

An exemplary embodiment of a method of driving the exemplary embodiment of an organic light emitting device 500 will be described in detail hereinafter.

First, when the voltage is applied to the intermediate electrode 40 and the upper electrode 70 of the second organic light emitting element 80, the electrons and the holes are transmitted from the upper electrode and the intermediate electrode 40, respectively, to the second organic light emitting member 60.

The electrons and holes injected into the second organic light emitting member 60 are recombined in the second organic light emitting member 60 to form excitons. The exciton falls into the ground state in the blue emitting layer B, thereby emitting a photon of a short wavelength corresponding to the energy difference between the excited state of the exciton and its ground state, wherein the photon may be perceived as visible light. Therefore, the blue light is emitted in the blue emitting layer B.

Meanwhile, the upper electrode 70 made of light reflecting materials and the intermediate electrode 40 made of semi-transparent materials form the microcavity.

Particularly, the upper electrode 70 forms the microcavity for improving the emission property of light generated in the second organic light emitting member 60.

The emission of light in the vicinity of the wavelength corresponding to the resonance wavelength of the microcavity is enhanced by the intermediate electrode 40, and light of other wavelength is restrained. That is, the wavelength of the desired range may be tuned so as to have high reflectance, low transmittance, and low absorption rate by using the structure of the upper electrode 70 and the intermediate electrode 40.

More specifically, light having the specified wavelength may be enhanced by controlling the thicknesses of the blue emitting layer B included in the organic light emitting member 60, the hole injecting and transport layers 61 and 62, the electron transport and injecting layers 63 and 64 and the thickness of the intermediate electrode 40.

Therefore, since light having the specified wavelength is selectively emitted, it is possible to improve the color purity of light having the specified wavelength band.

According to this exemplary embodiment of the present invention, it is possible to improve the color purity of the blue light emitted from the blue emitting layer B by using the microcavity. For this reason, a deep blue light is emitted from the second organic light emitting element 80 to the first organic light emitting element 50.

Meanwhile, when the voltage is also applied to the lower electrode 20 to drive the second organic light emitting element 80, the first organic light emitting element 50 is driven. In the current exemplary embodiment, the holes and electrodes are injected from the lower electrode 20 and the intermediate electrode 40, respectively, into the first organic light emitting member 30.

The electrons and holes injected into the first organic light emitting member 30 generate excitons, similar to the process described above. Moreover, excitons fall into the ground state in both the red emitting layer R and the green emitting layer G, thereby emitting light.

Accordingly, the red light and the green light are generated in the red emitting layer R and the green emitting layer G, respectively.

Meanwhile, since the deep blue light is emitted from the second organic light emitting element 80, the red light and the green light are combined with the deep blue light.

Therefore, the white light is made by the combination of the deep blue light, the red light, and the green light, all of which are emitted toward the transparent substrate 10.

As described above, by using the microcavity, it is possible to provide the deep blue light having high color purity without changing the material of the blue emitting layer B. Therefore, emission quality of the organic light emitting device may be improved, even though the conventional material of the blue emitting layer having a good lifetime and relatively low emission efficiency is used.

Furthermore, since the second organic light emitting element 80 including the blue emitting layer and the first organic light emitting element 50 including the red and green emitting layers are individually driven, it is possible to control the emission levels of both the first organic light emitting element 50 and the second organic light emitting element 80.

Accordingly, the white color-coordinate of the organic light emitting device 500 may be easily adjusted by controlling the luminance of light emitted from the first organic light emitting element 50 and the luminance of light emitted from the second organic light emitting element 80.

According to the current exemplary embodiment of the present invention, the light emitting device 500 was described with the blue emitting layer B in the second organic light emitting member 60 and the blue light was enhanced using the microcavity effect. However, alternative exemplary embodiments include configurations wherein the emitting layers of other colors in addition to the blue emitting layer may be included in the second organic light emitting element 80.

In another exemplary embodiment of an organic light emitting device according to the present invention will be described hereinafter.

Figure 28:
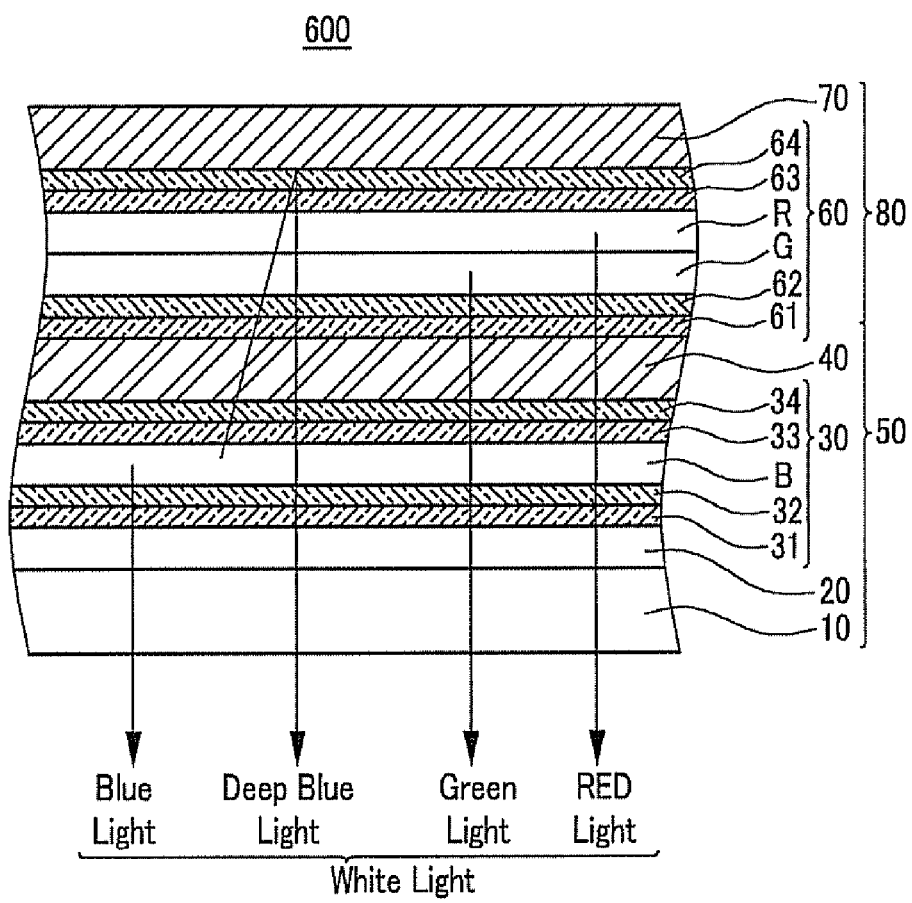
FIG. 28 is a schematic view showing another exemplary embodiment of an organic light emitting device according to the present invention.

FIG. 28 is a schematic view showing another exemplary embodiment of the organic light emitting device according to the present invention.

Referring to FIG. 28, an organic light emitting device 600 includes a transparent substrate 10, a lower electrode 20, a first organic light emitting member 30, an intermediate electrode 40, a second organic light emitting member 60, and an upper electrode 70.

The transparent substrate 10, the lower electrode 20, the intermediate electrode 40, and the upper electrode 70 have substantially the same structure as in the above-described exemplary embodiment, and the description thereof will be omitted herein.

The first organic light emitting member 30 is interposed between the lower electrode 20 and the intermediate electrode 40 and includes, as in the current exemplary embodiment illustrated in FIG. 28, the blue emitting layer B. In one exemplary embodiment the first organic light emitting member 30 may further include a hole injecting layer 31 and/or a hole transport layer 32 located between the blue emitting layer B and the lower electrode 20. In addition, in one exemplary embodiment the first organic light emitting member 30 may further include an electron transport layer 33 and/or an electron injecting layer 34 located between the blue emitting layer B and the intermediate electrode 40.

A first organic light emitting element 50 is provided which includes the lower electrode 20, the first organic light emitting member 30, and the intermediate electrode 40.

The second organic light emitting member 60 is interposed between the intermediate electrode 40 and the upper electrode 70 and includes, as in the exemplary embodiment shown in FIG. 28, the sequentially laminated green emitting layer G and the red emitting layer R. In alternative exemplary embodiments the laminating sequence of the green emitting layer G and the red emitting layer R may be changed.

In addition, in one exemplary embodiment the second organic light emitting member 60 may further include a hole injecting layer 61 and/or a hole transport layer 62 located between the intermediate layer 40 and the green emitting layer G, and the second organic light emitting member 60 may further include an electron transport layer 63 and/or an electron injecting layer 64 located between the red emitting layer R and the upper electrode 70.

A second organic light emitting element 80 is provided which includes the intermediate electrode 40, the second organic light emitting member 60, and the upper electrode 70.

An exemplary embodiment of a method of driving the exemplary embodiment of an organic light emitting device 600 will be described in detail hereinafter.

First, when the voltage is applied to the lower electrode 20 and the intermediate electrode 40 of the first organic light emitting element 50, the holes and the electrons are transmitted from the lower electrode 20 and the intermediate electrode 40, respectively, to the first organic light emitting member 30.

The electrons and holes injected into the first organic light emitting member 30 are recombined in the first organic light emitting member 30 to form the excitons. The exciton falls into the ground state, in the blue emitting layer B thereby emitting light. Therefore, the blue light is emitted in the blue emitting layer B.

A portion of the blue light emitted in the blue emitting layer B passes through the lower electrode 20 which is made of the transparent material to be emitted toward the transparent substrate 10, and the remaining blue light passes through the intermediate electrode 40 made of the opaque material to be emitted toward the upper electrode 70.

When a voltage is applied to the upper electrode 70 the second organic light emitting element 80 is driven at substantially the same time as the first organic light emitting element 50. Holes and electrons are injected from the intermediate electrode 40 and the upper electrode 70, respectively, into the second organic light emitting member 60.

The electrons and holes injected into the second organic light emitting element 80 recombine in the second organic light emitting member 60 to form the excitons. The exciton falls into the ground state in the green emitting layer and the red emitting layer, thereby emitting light. Therefore, the green light and the red light are generated in the green emitting layer G and the red emitting layer R, respectively. The green light and the red light pass through the intermediate electrode 40 made of a semi-transparent conductor to be emitted toward the transparent substrate 10.

Meanwhile, the upper electrode 70 made of the light reflecting conductor and the intermediate electrode 40 made of the semi-transparent conductor form the microcavity. The microcavity in this exemplary embodiment of the present invention is substantially similar to that in the exemplary embodiment described with reference to FIG. 27, and the description thereof will be omitted herein.

The microcavity effect is applied to light generated in the second organic light emitting layer in the exemplary embodiment described with reference to FIG. 27, but in the present exemplary embodiment the microcavity effect is applied to light which is generated in the first organic emitting member 30 and passes through the intermediate electrode 40.

Specifically, the blue light which is generated in the first organic emitting member 30 and passes through the intermediate electrode 40 is enhanced in the specified wavelength band by the microcavity formed by the intermediate electrode 40 and the upper electrode 70.

According to this exemplary embodiment of the present invention, in order to selectively improve the color purity of the blue light, the second organic light emitting member 60 and the intermediate electrode 40 are formed to a thickness capable of enhancing light of a blue wavelength.

Accordingly, the color purity of the blue light increases, and the deep blue light is reflected toward the transparent substrate 10 through the upper electrode 70 made of the reflective conductor.

The deep blue light is combined with the blue light emitted directly from the first organic light emitting member 30 to the transparent substrate 10 and the green and red light emitted from the second organic light emitting member 60 to form the white light.

For this reason, the white light is emitted in the transparent substrate 10.

By using the microcavity, it is possible to provide the deep blue light having high color purity without changing the material of the blue emitting layer B. Therefore, emission quality of the organic light emitting device may be improved, even though a conventional material is used in constructing the blue emitting layer. A conventional material having a good lifetime and emission efficiency may be used.

As described above, the organic light emitting element including the green and red emitting layers and the organic light emitting element including the blue emitting layer are individually formed. By applying the microcavity effect to light emitted from the blue emitting layer, it is possible to improve the color purity of the blue light without changing the material of the blue emitting layer. Therefore, emission quality of the organic light emitting device may be improved, even though a conventional material, having a good lifetime and emission efficiency, is used to construct the blue emitting layer.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting device comprising:
a plurality of colored pixels, and a white pixel, wherein the respective pixels comprise:
a first electrode;
a second electrode which faces the first electrode; and
a light emitting member disposed between the first electrode and the second electrode, and
the white pixel further comprises:
a first semi-transparent member disposed on the first electrode to form a microcavity with the second electrode.

2. The organic light emitting device of claim 1, wherein the first semi-transparent member is Ag, Al or a combination of Ag and Al.

3. The organic light emitting device of claim 1, wherein the light emitting member comprises:
a plurality of sub-emitting layers which emit light having different wavelengths; and
the light having different wavelengths are combined to emit a substantially white light.

4. The organic light emitting device of claim 3, wherein the white light has a yellowish tint.

5. The organic light emitting device of claim 3, wherein the first semi-transparent member is formed at only a portion of a region through which the white light passes.

6. The organic light emitting device of claim 3, wherein the plurality of colored pixels includes a red pixel, a green pixel, and a blue pixel, and each of the colored pixels further comprise a color filter formed below the first electrode.

7. The organic light emitting device of claim 3, wherein a pixel having the lowest emission efficiency among the plurality of colored pixels further comprises:
a second semi-transparent member disposed on the first electrode to form the microcavity together with the second electrode.

8. The organic light emitting device of claim 7, wherein the pixel having the lowest emission efficiency is a blue pixel.

9. The organic light emitting device of claim 7, wherein the second semi-transparent member is Ag, Al or a combination of Ag and Al.

10. The organic light emitting device of claim 7, wherein the second semi-transparent member is formed over substantially the entire region through which the white light passes.

11. The organic light emitting device of claim 7, wherein the plurality of colored pixels comprise a red pixel and a green pixel and the red pixel and the green pixel further comprise a color filter formed below the first electrode.

12. The organic light emitting device of claim 1, further comprising:
   a driving thin film transistor connected to the first electrode including a polycrystalline semiconductor; and
   a switching thin film transistor connected to the driving thin film transistor including an amorphous semiconductor.

13. The organic light emitting device of claim 12, wherein the driving thin film transistor comprises;
   a driving input electrode formed on the polycrystalline semiconductor,
   a driving output electrode which faces the driving input electrode on the polycrystalline semiconductor, and
   a driving control electrode formed on the driving input electrode and the driving output electrode.

14. The organic light emitting device of claim 13, wherein the switching thin film transistor comprises;
   a switching control electrode formed below the amorphous semiconductor,
   a switching input electrode formed on the amorphous semiconductor, and
   a switching output electrode which faces the switching input electrode on the amorphous semiconductor and is connected to the driving control electrode.

* * * * *